US012692459B2

(12) United States Patent
Yoshino

(10) Patent No.: US 12,692,459 B2
(45) Date of Patent: Jul. 28, 2026

(54) COMPOSITION FOR SURFACE TREATMENT, SURFACE TREATMENT METHOD, AND METHOD FOR PRODUCING SEMICONDUCTOR SUBSTRATE

(71) Applicant: FUJIMI INCORPORATED, Aichi (JP)

(72) Inventor: Tsutomu Yoshino, Aichi (JP)

(73) Assignee: FUJIMI INCORPORATED, Aichi (JP)

( * ) Notice: Subject to any disclaimer, the term of this patent is extended or adjusted under 35 U.S.C. 154(b) by 209 days.

(21) Appl. No.: 18/122,016

(22) Filed: Mar. 15, 2023

(65) Prior Publication Data

US 2023/0313070 A1 Oct. 5, 2023

(30) Foreign Application Priority Data

Mar. 30, 2022 (JP) ................................. 2022-056460

(51) Int. Cl.

| | |
|---|---|
| ***C11D 1/83*** | (2006.01) |
| ***C09G 1/02*** | (2006.01) |
| ***C11D 1/00*** | (2006.01) |
| ***C11D 1/14*** | (2006.01) |
| ***C11D 1/76*** | (2006.01) |
| ***H10P 52/40*** | (2026.01) |
| ***H10P 95/00*** | (2026.01) |

(52) U.S. Cl.

CPC .................. *C11D 1/83* (2013.01); *C09G 1/02* (2013.01); *H10P 52/403* (2026.01); *H10P 95/062* (2026.01); *C11D 1/008* (2013.01); *C11D 1/143* (2013.01); *C11D 1/76* (2013.01); *C11D 2111/22* (2024.01)

(58) Field of Classification Search

None

See application file for complete search history.

(56) References Cited

U.S. PATENT DOCUMENTS

| | | | | |
|---|---|---|---|---|
| 2014/0349483 A1* | 11/2014 | Li | G09G 1/02 438/693 |
| 2019/0093056 A1* | 3/2019 | Yoshino | C11D 3/3707 |
| 2019/0390139 A1 | 12/2019 | Tamboli | |

FOREIGN PATENT DOCUMENTS

| | | | |
|---|---|---|---|
| CN | 110643434 A | 1/2020 | |
| EP | 3588535 B1 * | 9/2023 | C11D 7/265 |
| JP | 2020-167237 A | 10/2020 | |

OTHER PUBLICATIONS

Office Action from TW Application No. 112106897, with a mailing date of Feb. 12, 2025.

* cited by examiner

*Primary Examiner* — Stephanie P Duclair

(74) *Attorney, Agent, or Firm* — KATTEN MUCHIN ROSENMAN LLP

(57) ABSTRACT

Means capable of sufficiently removing residues remaining on a surface of a polished object containing silicon nitride and at least one selected from the group consisting of silicon oxide and polysilicon is provided. A composition for surface treatment, comprising: a nitrogen-free nonionic polymer, a nitrogen-containing nonionic polymer, and an anionic polymer, wherein the nitrogen-free nonionic polymer has a weight-average molecular weight of less than 100,000, the ratio of a weight-average molecular weight of the nitrogen-containing nonionic polymer to the weight-average molecular weight of the nitrogen-free nonionic polymer (nitrogen-containing nonionic polymer/nitrogen-free nonionic polymer) is 0.1 or more and 10 or less, and the composition for surface treatment has a pH of less than 7.0.

17 Claims, No Drawings

COMPOSITION FOR SURFACE TREATMENT, SURFACE TREATMENT METHOD, AND METHOD FOR PRODUCING SEMICONDUCTOR SUBSTRATE

CROSS-REFERENCE TO RELATED APPLICATION

The present application is based on the Japanese patent application No. 2022-056460 filed on Mar. 30, 2022, and the disclosed contents thereof is incorporated herein by reference in their entirety.

TECHNICAL FIELD

The present invention relates to a composition for surface treatment, a surface treatment method, and a method for producing a semiconductor substrate.

BACKGROUND ART

In recent years, a so-called chemical mechanical polishing (CMP) technique for physically polishing and flattening a semiconductor substrate in producing a device is used in accordance with multilayer wiring on a surface of a semiconductor substrate. CMP is a method for flattening a surface of an object to be polished (polishing object) such as a semiconductor substrate using a polishing composition (slurry) containing abrasive grains such as silica, alumina, or ceria, an anti-corrosion agent, a surfactant, or the like. The object to be polished (polishing object) is silicon, polysilicon, silicon oxide, silicon nitride, a wiring or a plug which consists of metal, or the like.

On a surface of a semiconductor substrate after the CMP step, impurities (also referred to as foreign matter or residues) remain in a large amount. Impurities include abrasive grains, metals, an anti-corrosion agent and organic matter such as a surfactant, which are derived from a polishing composition used for CMP, a silicon-containing material or a metal which is generated by polishing of a silicon-containing material, metal wiring, a plug or the like as an object to be polished, and also organic matter such as pad debris which is generated from various pads.

Once a surface of a semiconductor substrate is contaminated with these impurities, the electrical properties of the semiconductor may be adversely affected, so as to lower device reliability. Hence, it is desired to remove these impurities from the surface of a semiconductor substrate by introducing a cleaning step following the CMP step.

For example, Japanese Patent Laid-Open No. 2020-167237 discloses a rinse composition for silicon wafers containing a water-soluble polymer that satisfies specific conditions as such a cleaning composition, and discloses that this can remove foreign matter on silicon wafers after polishing and reduce defects on the silicon wafers after the polishing.

SUMMARY OF INVENTION

However, the technique of Japanese Patent Laid-Open No. 2020-167237 is problematic in that foreign matter (residues) cannot be sufficiently removed in the cleaning of a polished object containing silicon nitride and at least one selected from the group consisting of silicon oxide and polysilicon.

Therefore, an object of the present invention is to provide means capable of sufficiently removing residues remaining on a surface of a polished object containing silicon nitride and at least one selected from the group consisting of silicon oxide and polysilicon.

Solution to Problem

The inventors of the present invention have intensively studied in view of the above problem. As a result, the inventors of the present invention have discovered that the above problem is solved by a composition for surface treatment, comprising: a nitrogen-free nonionic polymer, a nitrogen-containing nonionic polymer, and an anionic polymer, wherein the nitrogen-free nonionic polymer has a weight-average molecular weight of less than 100,000, and a ratio of a weight-average molecular weight of the nitrogen-containing nonionic polymer to the weight-average molecular weight of the nitrogen-free nonionic polymer (nitrogen-containing nonionic polymer/nitrogen-free nonionic polymer) is 0.1 or more and 10 or less, and the composition for surface treatment has a pH of less than 7.0, and thus have completed the present invention.

DESCRIPTION OF EMBODIMENTS

A composition for surface treatment according to an embodiment of the present invention is a composition for surface treatment, comprising: a nitrogen-free nonionic polymer, a nitrogen-containing nonionic polymer, and an anionic polymer, wherein the nitrogen-free nonionic polymer has a weight-average molecular weight of less than 100,000, and a ratio of a weight-average molecular weight of the nitrogen-containing nonionic polymer to the weight-average molecular weight of the nitrogen-free nonionic polymer (nitrogen-containing nonionic polymer/nitrogen-free nonionic polymer) is 0.1 or more and 10 or less, and the composition for surface treatment has a pH of less than 7.0. According to such a composition for surface treatment of the present invention, residues remaining on the surface of a polished object containing silicon nitride and at least one selected from the group consisting of silicon oxide and polysilicon can be sufficiently removed. Note that the term "polished object" used herein refers to an object to be polished that has been polished with the polishing composition. In the present invention, the polished object contains silicon nitride and at least one selected from the group consisting of silicon oxide and polysilicon. The term "polished object containing silicon nitride" means that the polished object has a film (layer) containing silicon nitride. The term "polished object containing silicon oxide" means that the polished object has a film (layer) containing silicon oxide. The term "polished object containing polysilicon" means that the polished object has a film (layer) containing polysilicon. That is, the polished object according to the present invention has a film (layer) containing silicon nitride and a film (layer) containing at least one selected from the group consisting of silicon oxide and polysilicon. Hereinafter, "the polished object containing silicon nitride and at least one selected from the group consisting of silicon oxide and polysilicon" may be referred to merely as the "polished object".

The inventors of the present invention infer the mechanism of removing residues on a surface of a polished object with the above configuration, as follows.

That is, when components contained in the composition for surface treatment act on the surface of the polished object, residues are removed from the surface of the polished object. Specifically, the adsorption of the nitrogen-containing nonionic polymer, the nitrogen-free nonionic polymer, and the anionic polymer to the surface of the polished object enables the desorption of residues existing on the surface of the polished object. The inventors of the present invention have discovered that when the pH is less than 7.0, the weight-average molecular weight of the nitrogen-free nonionic polymer was less than 100,000, and the ratio of the weight-average molecular weight of the nitrogen-containing nonionic polymer to the weight-average molecular weight of the nitrogen-free nonionic polymer (nitrogen-containing nonionic polymer/nitrogen-free nonionic polymer) is 0.1 or more and 10 or less, these residues on the surface of the polished object can be more efficiently removed in the removal of the residues. Although details of these mechanisms are unclear, it is believed that setting the above configuration facilitates adsorbing the nitrogen-free nonionic polymer, the nitrogen-containing nonionic polymer, and the anionic polymer to the polished object more effectively, and this can prevent the re-adhesion of residues (contaminants) to the surface of the polished object while desorbing the residues on the surface of the polished object more efficiently.

The anionic polymer easily adsorbs to a film containing silicon nitride, and the composition for surface treatment of the present invention can suitably exhibits the above effect on the film containing the silicon nitride. The nitrogen-containing nonionic polymer easily adsorbs to a film containing silicon oxide and/or a film containing polysilicon, and the composition for surface treatment of the present invention can suitably exhibits the above effect on the film containing silicon oxide and/or the film containing polysilicon. Furthermore, the nitrogen-containing nonionic polymer easily interacts with the nitrogen-free nonionic polymer. For example, when nitrogen atoms of the nitrogen-containing nonionic polymer and oxygen atoms of the nitrogen-free nonionic polymer form hydrogen bonding, a hydrophilic film can be formed on the film containing silicon oxide and/or the film containing polysilicon, and the above effect is still further exhibited thereby. When nitrogen atoms of the nitrogen-containing nonionic polymer form hydrogen bonding with hydroxyl groups existing on the surface of the film containing the silicon oxide, the nitrogen-containing nonionic polymer can adsorb to the film containing silicon oxide particularly effectively, and the above effect is still further exhibited thereby.

Furthermore, when the above configuration is set, the components (the nitrogen-containing nonionic polymer, the nitrogen-free nonionic polymer, and the nitrogen-free nonionic polymer) adsorbed to the surface of the polished object can also be easily desorbed from the surface of the polished object, and this enables the components themselves adsorbed to the surface of the polished object hardly or not to remain as residues. It is believed from the above that the composition for surface treatment of the present invention can sufficiently remove residues.

Note that the above mechanism is based on the inference, and the present invention is not limited by the above mechanism.

The embodiments of the present invention will be described in detail as follows, but the present invention is not limited to the following embodiments alone. Throughout the present specification, unless particularly stated otherwise, any expression in a singular form should be understood to encompass the concept of its plural form. Therefore, unless particularly stated otherwise, the article specifying a single form (for example, “a”, “an”, “the”, and the like in the case of English language) should be understood to encompass the concept of its plural form. Furthermore, unless particularly stated otherwise, any term used in the present specification should be understood as a term that is used to have the meaning conventionally used in the relevant technical field. Therefore, unless defined otherwise, all the technical terms and scientific terms used in the present specification have the same meaning as generally understood by a person ordinarily skilled in the art to which the present invention is pertained. If there is any conflict in meaning, the present specification (including the definitions) takes priority. In addition, in this specification, unless otherwise specified, operation and measurement of physical properties, etc., are performed under conditions of room temperature (20° C. or higher and 25° C. or lower)/relative humidity of 40% RH or more and 50% RH or less.

<Residue>

The term “residue(s)” used herein refers to foreign matter adhered to a surface of a polished object. Examples of a residue include, but are not particularly limited to, later-described organic residues, particle residues derived from abrasive grains contained in a polishing composition, residues composed of components other than particle residues, and organic residues, and other residues such as mixtures of particle residues and organic residues.

The total number of residues represents the total number of all residues regardless of the types. The total number of residues can be measured using a wafer defect inspection apparatus (an optical inspector Surfscan (registered trademark) SP5; manufactured by KLA-Tencor Japan Ltd.). A method for measuring the number of residues is described in detail in the following Examples.

The term “organic residue(s)” used herein represents, among foreign matter adhered to a surface of a polished object (object to be surface-treated), components comprising organic matters, organic salts, and the like such as organic low molecular weight compounds and polymer compounds.

Examples of organic residues adhered to a polished object include pad debris that are generated from pads used in later-described polishing step or rinse polishing step, or components derived from additives contained in polishing compositions that are used in the polishing step or compositions for surface treatment used in the rinse polishing step.

Note that since organic residues and other foreign matter are significantly different from each other in terms of color and shape, whether or not the foreign matter is an organic residue can be visually confirmed by SEM observation. Whether or not foreign matter is an organic residue can be determined as necessary by elementary analysis using energy-dispersive X-ray spectroscopy (EDX). The number of organic residues can be measured using a wafer defect inspection apparatus and SEM or EDX elementary analysis.

<Polished Object (the Polishing Object that has been Polished)>

The term “polished object” used herein refers to an object to be polished that has been polished in a polishing step. The polishing step is not particularly limited, but is preferably a CMP step.

The polished object (object to be polished) according to the present invention contains silicon nitride (SiN) and at least one selected from the group consisting of silicon oxide ($SiO_2$) and polysilicon (polycrystalline silicon). In a preferred embodiment of the present invention, the polished object (object to be polished) contains silicon nitride (SiN), silicon oxide ($SiO_2$), and polysilicon (polycrystalline silicon).

As long as the object to be polished contains silicon nitride (SiN) and at least one selected from the group consisting of silicon oxide ($SiO_2$) and polysilicon (polycrystalline silicon), materials contained in the object to be polished according to the present invention are not particularly limited. The object to be polished may further contain carbon-containing silicon such as silicon carbonitride (SiCN); non-crystalline silicon (amorphous silicon); silicon material doped with impurities; metal simple substances; alloys; metal nitrides; and compound semiconductors such as SiGe.

Examples of a silicon oxide-containing film include a TEOS (Tetraethyl Orthosilicate)-type silicon oxide film (hereinafter may also be simply referred to as "TEOS film") that is formed using tetraethyl orthosilicate as a precursor, an HDP (High Density Plasma) film, an USG (Undoped Silicate Glass) film, a PSG (Phosphorus Silicate Glass) film, a BPSG (Boron-Phospho Silicate Glass) film, and an RTO (Rapid Thermal Oxidation) film. The silicon oxide-containing film contained in the polished object may be of only one type or of two or more types in combination.

The polished object is preferably a polished semiconductor substrate, and is more preferably a semiconductor substrate after the CMP step. The reason for this is that, since residues can break a semiconductor device. When a polished object is a polished semiconductor substrate, a step for cleaning the semiconductor substrate is required to be able to remove residues as far as possible.

Further, the composition for surface treatment according to an embodiment of the present invention can reduce residues on the surface of even a polished object containing both a hydrophilic material and a hydrophobic material. Here, the term "hydrophilic material" refers to a material having a contact angle with respect to water of less than 50°, and the term "hydrophobic material" refers to a material having a contact angle with respect to water of 50° or more. Note that the contact angle with respect to water is a value measured using a contact angle meter, Drop Master (manufactured by Kyowa Interface Science Co., Ltd., DMo-501).

Specific examples of the hydrophilic material include silicon oxide, silicon nitride, silicon oxynitride, tungsten, titanium nitride, tantalum nitride, and boron-containing silicon. These hydrophilic materials may be used singly or in combinations of two or more thereof. According to a preferred embodiment of the present invention, the above hydrophilic material is silicon nitride. According to a preferred embodiment of the present invention, the above hydrophilic material is silicon nitride and silicon oxide. Further, specific examples of the hydrophobic material include polycrystalline silicon, single crystal silicon, non-crystalline silicon, and carbon-containing silicon. These hydrophobic materials may be used singly or in combinations of two or more thereof. According to a preferred embodiment of the present invention, the hydrophobic material is polycrystalline silicon.

That is, according to a preferred embodiment of the present invention, the above hydrophilic material is silicon nitride, and the above hydrophobic material is polycrystalline silicon. Further, according to a preferred embodiment of the present invention, the above hydrophilic material is silicon nitride and silicon oxide, and the above hydrophobic material is polycrystalline silicon.

<Composition for Surface Treatment>

The composition for surface treatment according to the present invention contains the nitrogen-free nonionic polymer, the nitrogen-containing nonionic polymer, and the anionic polymer. Here, the term "polymer" used herein refers to a compound having a weight-average molecular weight (Mw) of 1000 or more. Further, the term "nonionic polymer" used herein refers to a polymer not having an anionic group such as a carboxylic acid group, a sulfonic acid group, or a phosphoric acid group or a cationic group such as an amino group or a quaternary ammonium group in a molecule. The term "anionic polymer" refers to a polymer having an anionic group such as a carboxylic acid group, a sulfonic acid group, and a phosphoric acid group in a molecule. Hereinafter, the polymers will be described.

(Nitrogen-Free Nonionic Polymer)

The nitrogen-free nonionic polymer contained in the composition for surface treatment according to the present invention has a weight-average molecular weight of less than 100,000. When the weight-average molecular weight of the nitrogen-free nonionic polymer is 100,000 or more, the nitrogen-free nonionic polymer remains on the surface of the polished object even after the final cleaning, and the nitrogen-free nonionic polymer itself becomes defects. Further, as described later, the weight-average molecular weight of the nitrogen-free nonionic polymer is also characterized in that the ratio of the weight-average molecular weight of the nitrogen-containing nonionic polymer to the weight-average molecular weight of the nitrogen-free nonionic polymer is within a specific range. When the weight-average molecular weight of the nitrogen-free nonionic polymer is within the above range, the nitrogen-free nonionic polymer is easily adsorbed to the polished object, and residues can be efficiently removed.

The weight-average molecular weight of the nitrogen-free nonionic polymer is preferably 1,500 or more, more preferably 2,000 or more, further preferably 3,000 or more, further more preferably 4,500 or more, particularly preferably 5,500 or more, and the most preferably 7,500 or more. Further, the weight-average molecular weight of the nitrogen-free nonionic polymer is preferably 95,000 or less, more preferably 90,000 or less, and is further preferably 80,000 or less, further more preferably 50,000 or less, particularly preferably 30,000 or less, particularly more preferably 25000 or less, and the most preferably 20,000 or less. That is, the weight-average molecular weight of the nitrogen-free nonionic polymer is preferably 1,500 or more and 95,000 or less, more preferably 2,000 or more and 90,000 or less, further preferably 3,000 or more and 80,000 or less, further more preferably 4,500 or more and 50,000 or less, particularly preferably 5,500 or more and 30,000 or less, particularly more preferably 7,500 or more and 25,000 or less, and the most preferably 7,500 or more and 20,000 or less. When the weight-average molecular weight of the nitrogen-free nonionic polymer is within the above range, after the treatment using the composition for surface treatment, residues on the surface of the polished object can be more efficiently removed, and expected effect of the present invention is further exhibited. Note that the weight-average molecular weights (Mw) of the polymers such as the nitrogen-free nonionic polymer, the nitrogen-containing nonionic polymer, and the anionic polymer can be measured as values in terms of polyethylene glycol using gel permeation chromatography (GPC) herein.

When the weight-average molecular weight of the nitrogen-free nonionic polymer is within the above range, the nitrogen-free nonionic polymer is easily adsorbed to the polished object (for example, a film containing polysilicon), after the treatment using the composition for surface treatment, residues on the surface of the polished object can be more efficiently removed, and the expected effect of the present invention is further exhibited.

Although the nitrogen-free nonionic polymer only has to be a nonionic polymer having no nitrogen atoms, the nitrogen-free nonionic polymer is preferably a nonionic polymer having no nitrogen atoms and having oxygen atoms. Examples of the nitrogen-free nonionic polymer include polyvinyl alcohol; polyvinyl ethers (polyvinyl methyl ether, polyvinyl ethyl ether, polyvinyl isobutyl ether, etc.); polyalkylene oxides (polyethylene oxide, polypropylene oxide, polybutylene oxide, etc.); polyglycerol; polyethylene glycol; polypropylene glycol; polybutylene glycol; water-soluble polysaccharides such as hydroxyethyl cellulose; alginic acid polyhydric alcohol esters; water-soluble urea resins; dextrin derivatives; and casein. Furthermore, as the nitrogen-free nonionic polymer, not only those having the above main chain structures, but also graft copolymers having nonionic polymer structures in the side chains can also be suitably used. The nitrogen-free nonionic polymer may be a polymer having the same repeating constitutional units (homopolymer) or different repeating constitutional units from each other (copolymer). Further, the form of a copolymer when the nitrogen-free nonionic polymer is the copolymer may be any of a block copolymer, a random copolymer, a graft copolymer, and an alternating copolymer.

The nitrogen-free nonionic polymer is preferably polyvinyl alcohol, polyethylene glycol, polypropylene glycol, or hydroxyethyl cellulose, and is more preferably polyvinyl alcohol. The nitrogen-free nonionic polymer may be used in combinations of two or more thereof.

The content of the nitrogen-free nonionic polymer in the composition for surface treatment is preferably 0.001 mass % or more and 10 mass % or less, more preferably 0.005 mass % or more and 5 mass % or less, further preferably 0.07 mass % or more and 3 mass % or less, particularly preferably 0.01 mass % or more and 1 mass % or less, and the most preferably 0.01 mass % or more and 0.5 mass % or less with respect to the total mass of the composition for surface treatment. When two or more types of nitrogen-free nonionic polymers are contained in the composition for surface treatment, the content of the nitrogen-free nonionic polymers is the total amount thereof.

(Nitrogen-Containing Nonionic Polymer)

The weight-average molecular weight of the nitrogen-containing nonionic polymer contained in the composition for surface treatment according to the present invention is 0.1 times or more and 10 times or less the weight-average molecular weight of the nitrogen-free nonionic polymer. That is, the ratio of the weight-average molecular weight of the nitrogen-containing nonionic polymer to the weight-average molecular weight of the nitrogen-free nonionic polymer ("the weight-average molecular weight of nitrogen-containing nonionic polymer/the weight-average molecular weight of the nitrogen-free nonionic polymer") is 0.1 or more and 10 or less. When the ratio of the weight-average molecular weight of the nitrogen-containing nonionic polymer to the weight-average molecular weight of the nitrogen-free nonionic polymer is in the above range, the nitrogen-free nonionic polymer and the nitrogen-containing nonionic polymer is easily adsorbed to the polished object, and residues can be efficiently removed. Hereinafter, the ratio of the weight-average molecular weight of the nitrogen-containing nonionic polymer to the weight-average molecular weight of the nitrogen-free nonionic polymer may be simply referred to as the "molecular weight ratio of the nitrogen-containing/nitrogen-free". When the molecular weight ratio of nitrogen-containing/nitrogen-free is less than 0.1, the molecular weight of the nitrogen-free nonionic polymer is high, and the nitrogen-free nonionic polymer itself may therefore be organic residues. Meanwhile, when the molecular weight ratio of nitrogen-containing/nitrogen-free exceeds 10, the molecular weight of the nitrogen-containing nonionic polymer is high, and the nitrogen-containing nonionic polymer itself may therefore be organic residues.

The molecular weight ratio of nitrogen-containing/nitrogen-free is preferably 0.1 or more and 8 or less, more preferably 0.2 or more and 6.5 or less, further preferably 0.3 or more and 6 or less, particularly preferably 0.5 or more and 5.5 or less, particularly more preferably 2 or more and less than 5.5, and the most preferably 2.5 or more and 5.3 or less. When the molecules weight ratio of nitrogen-containing/nitrogen-free is within the above range, the nitrogen-free nonionic polymer and the nitrogen-containing nonionic polymer are easily adsorbed to the polished object (e.g., a film containing silicon oxide and a film containing polysilicon). After the treatment using the composition for surface treatment, residues on the surface of the polished object can be more efficiently removed, and the expected effect of the present invention is further exhibited.

The weight-average molecular weight of the nitrogen-containing nonionic polymer is preferably 1,500 or more, more preferably 3,000 or more, further preferably 5,000 Or more, further more preferably 10,000 or more, particularly preferably 25,000 or more, and the most preferably 35,000 or more. Further, the weight-average molecular weight of the nitrogen-containing nonionic polymer is preferably 1,000,000 or less, more preferably 500,000 or less, further preferably 300,000 or less, further more preferably 100,000 or less, particularly preferably 80,000 or less, and the most preferably 60,000 or less. That is, the weight-average molecular weight of the nitrogen-free nonionic polymer is preferably 1,500 or more and 1,000,000 or less, more preferably 3,000 or more and 500,000 or less, further preferably 5,000 or more and 300,000 or less, further more preferably 10,000 or more and 100,000 or less, particularly preferably 25,000 or more and 80,000 or less, and the most preferably 35,000 or more and 60,000 or less. When the weight-average molecular weight of the nitrogen-free nonionic polymer is within the above range, after the treatment using the composition for surface treatment, residues on the surface of the polished object can be more efficiently removed, and the expected effect of the present invention is further exhibited.

The nitrogen-containing nonionic polymer only has to be a nonionic polymer having nitrogen atoms. Examples include polyamines, polyvinylpyrrolidone, polyacrylamide, poly-N-vinylacetamide, polydimethylacrylamide, polyacryloylmorpholine, poly-N-vinylcaprolactam, poly-N-isopropylacrylamide, and oxazoline group-containing polymers. As the nitrogen-containing nonionic polymer, not only those having the above main chain structures, but also graft copolymers having nonionic polymer structures in the side chains can also be suitably used. The nitrogen-containing nonionic polymer may be a polymer having the same repeating constitutional units (homopolymer) or different repeating constitutional units from each other (copolymer). The form of a copolymer when the nitrogen-containing nonionic polymer is the copolymer may be any of a block copolymer, a random copolymer, a graft copolymer, and an alternating copolymer.

The nitrogen-containing nonionic polymer is preferably a polymer having an amide bond, and is more preferably one or more selected from the group consisting of polyvinylpyrrolidone, poly-N-vinylacetamide, polydimethylacrylamide, polyvinyl caprolactam, N-isopropylacrylamide, and oxazoline group-containing polymers. The nitrogen-containing nonionic polymer may be used in combinations of two or more thereof.

The content of the nitrogen-containing nonionic polymer in the composition for surface treatment is preferably 0.001 mass % or more and 10 mass % or less, more preferably 0.005 mass % or more and 5 mass % or less, further preferably 0.07 mass % or more and 3 mass % or less, particularly preferably 0.01 mass % or more and 1 mass % or less, and the most preferably 0.01 mass % or more and 0.5 mass % or less with respect to the total mass of the composition for surface treatment. When two or more types of nitrogen-containing nonionic polymers are contained in the composition for surface treatment, the content of the nitrogen-containing nonionic polymer is the total amount thereof.

(Anionic Polymer)

The anionic polymer contained in the composition for surface treatment according to the present invention acts as a dispersant in the composition for surface treatment. When the anionic polymer is contained in the composition for surface treatment, both zeta potentials of the surface of the polished object (e.g., a polished object containing silicon nitride) and defect sorces such as abrasive grains and organic residues are negatively controlled to form electrostatic repulsion layers, so that this enables reducing the number of defects of the polished object.

The weight-average molecular weight of the anionic polymer is preferably 1,500 or more, more preferably 3,000 or more, further preferably 4,000 or more, and further more preferably 5,000 or more, particularly preferably 6,000 or more, particularly more preferably 7000 or more, and the most preferably 8,000 or more. Further, the weight-average molecular weight of the anionic polymer is preferably 1,000,000 or less, more preferably 500,000 or less, further preferably 100,000 or less, further more preferably 50,000 or less, particularly preferably 25,000 or less, particularly more preferably 20,000 or less, and the most preferably 15,000 or less. That is, the weight-average molecular weight of the anionic polymer is preferably 1,500 or more and 1,000,000 or less, more preferably 3,000 or more and 500,000 or less, further preferably 4,000 or more and 100,000 or less, further more preferably 5,000 or more and 50,000 or less, particularly preferably 6,000 or more and 25,000 or less, particularly more preferably 7,000 or more and 20,000 or less, and the most preferably 8,000 or more and 15,000 or less. When the weight-average molecular weight of the anionic polymer is within the above range, after the treatment using the composition for surface treatment, and residues on the surface of the polished object can be more efficiently removed, and the expected effect of the present invention is further exhibited.

The anionic polymer only has to have anionic groups, and specific examples include polyvinyl sulfonic acid, polystyrene sulfonic acid, polyallyl sulfonic acid, polymethallyl sulfonic acid, poly(2-acrylamide-2-methylpropane sulfonic acid), polyisoprene sulfonic acid, polyacrylic acid, polymethacrylic acid, a (meth)acrylic acid-isoprene sulfonic acid copolymer, a (meth)acrylic acid-[2-(meth)acrylamide-2-methylpropane sulfonic acid] copolymer, and a (meth) acrylic acid-isoprene sulfonic acid-[2-(meth)acrylamide-2-methylpropane sulfonic acid] copolymer. These anionic polymers may have neutralized salt forms.

Furthermore, as the anionic polymer, not only those having the above main chain structures, but also graft copolymers having anionic polymer structures in the side chains can also be suitably used. The anionic polymer may be a polymer having the same repeating constitutional units (homopolymer) or different repeating constitutional units from each other (copolymer). The form of a copolymer when the anionic polymer is the copolymer may be any of a block copolymer, a random copolymer, a graft copolymer, and an alternating copolymer.

The anionic polymer may be used in combinations of two or more thereof. When two or more types of anionic polymers are contained in the composition for surface treatment, the content of the anionic polymer is the total amount thereof.

The content of the anionic polymer in the composition for surface treatment is preferably 0.001 mass % or more and 10 mass % or less, more preferably 0.005 mass % or more and 1 mass % or less, further preferably 0.07 mass % or more and 0.5 mass % or less, particularly preferably 0.008 mass % or more and 0.3 mass % or less, and the most preferably 0.009 mass % or more and 0.1 mass % or less with respect to the total mass of the composition for surface treatment.

(Other Polymers)

The composition for surface treatment according to the present invention may further contain another polymer than the above nitrogen-free nonionic polymer, nitrogen-containing nonionic polymer, and anionic polymer. As the other polymer, either of a cationic polymer and an amphoteric polymer can be used. Further, the other polymer is preferably a water-soluble polymer. The water-soluble polymer used here refers to a water-soluble polymer having the same repeating constitutional units (homopolymer) or a water-soluble polymer having different repeating constitutional units from each other (copolymer), and is typically a compound having a weight-average molecular weight (Mw) of 1000 or more.

Examples of the cationic polymer include polyethylenimine (PEI), polyvinyl amine, polyallyl amine, polyvinyl pyridine, and cationic acrylamide polymers.

Examples of the amphoteric polymer include a copolymer of a vinyl monomer having an anionic group and a vinyl monomer having a cationic group, and an amphoteric vinyl polymer having a carboxybetaine group or a sulfobetaine group. Specific examples thereof include an acrylic acid/dimethylaminoethyl methacrylic acid copolymer, and an acrylic acid/diethylaminoethyl methacrylic acid copolymer.

<Solvent>

The composition for surface treatment according to the present invention contains a solvent. A solvent has a function of dispersing or dissolving each component. The solvent preferably contains water and is more preferably made of water alone. Further, the solvent may also be a mixed solvent of water and an organic solvent in order to disperse or dissolve each component. In this case, examples of an organic solvent to be used herein include water-miscible organic solvents such as acetone, acetonitrile, ethanol, methanol, isopropanol, glycerin, ethylene glycol, and propylene glycol. Moreover, these organic solvents may be used without mixing with water to disperse or dissolve each component, and then mixed with water. These organic solvents may be used singly or in combinations of two or more thereof.

Water preferably contains impurities in an amount as low as possible from the viewpoint of preventing contamination of the polished object and the inhibition of the action of other components. For example, water having a total content of transition metal ions of 100 ppb or less is preferable. Here, the purity of water can be increased by, for example, operation such as removal of impurity ions with an ion exchange resin, removal of foreign matter with a filter, distillation, or the like. Specifically, for example, the use of deionized water (ion exchanged water), pure water, ultrapure water, distilled water or the like is preferable.

(Chelating Agent)

The composition for surface treatment according to an embodiment of the present invention preferably contains a chelating agent. When the composition for surface treatment contains a chelating agent, abrasive grain residues can be further reduced. Further, the chelating agent also has the function of adjusting the pH of the composition for surface treatment. The chelating agent is preferably an organic compound having at least one phosphoric acid group ($-OP(=O)(OH)_2$), and more preferably an organic compound having two or more phosphoric acid groups ($-OP(=O)(OH)_2$). That is, in an embodiment, the composition for surface treatment of the present invention further contains a chelating agent having two or more phosphoric acid groups. Specific examples of the chelating agents include orthophosphoric acid, methyl acid phosphate, ethyl acid phosphate, ethyl glycol acid phosphate, isopropyl acid phosphate, butyl acid phosphate, 2-ethylhexy acid phosphate, pentetic acid, phytic acid, etidronic acid, edetic acid, 1-hydroxyethylidene-1,1-diphosphonic acid (HEDP), polyphosphoric acid, metaphosphoric acid, hexametaphosphoric acid, phosphonobutane tricarboxylic acid, ethylenediamine tetra(methylene phosphonic acid), diethylenetriamine penta(methylene phosphonic acid), aminotrimethylene phosphonic acid, or salts thereof.

(Surfactant)

The composition for surface treatment according to the present invention may further contain a surfactant. The type of a surfactant is not particularly limited and may be any of nonionic, anionic, cationic and amphoteric surfactants.

Examples of a nonionic surfactant include the compound other than the above nitrogen-free nonionic polymer and nitrogen-containing nonionic polymer, and examples include an alkyl ether type such as polyoxyethylene lauryl ether and polyoxyethylene oleyl ether; an alkyl phenyl ether type such as polyoxyethylene octyl phenyl ether; an alkyl ester type such as polyoxyethylene laurate; an alkylamine type such as polyoxyethylene laurylamino ether; an alkylamide type such as polyoxyethylene lauramide; a polypropylene glycol ether type such as polyoxyethylene polyoxypropylene ether; an alkanolamide type such as oleic acid diethanolamide; and an allyl phenyl ether type such as polyoxyalkylene allyl phenyl ether. In addition to these examples, propylene glycol, diethylene glycol, monoethanolamine, alcohol ethoxylate, alkylphenol ethoxylate, tertiary acetylene glycol, alkanolamide or the like can also be used as a nonionic surfactant. Note that since the above nitrogen-free nonionic polymer and nitrogen-containing nonionic polymer can have functions as the nonionic surfactants, a separate nonionic surfactant does not need to be added.

Examples of an anionic surfactant include compounds other than the above anionic polymer, and include a carboxylic acid type such as sodium myristate, sodium palmitate, sodium stearate, sodium laurate, and potassium laurate; a sulfuric acid ester type such as sodium octylsulfonate; a phosphoric acid ester type such as lauryl phosphate, and sodium lauryl phosphate; and a sulfonic acid type such as dioctyl sulfosuccinate sodium, and sodium dodecylbenzenesulfonate. Note that since the above anionic polymer can have a function as the anionic surfactant, a separate anionic surfactant does not need to be added.

Examples of a cationic surfactant include amines such as laurylamine hydrochloride; quaternary ammonium salts such as polyethoxyamine, and lauryltrimethylammonium chloride; and pyridinium salts such as laurylpyridinium chloride.

Examples of an amphoteric surfactant include alkyl betaines or sulfobetaines such as lecithin, alkylamine oxide, and N-alkyl-N,N-dimethyl ammonium betaine.

The surfactants may be used singly or in combinations of two or more thereof. Further, as a surfactant, a commercial product thereof or a synthetic product thereof may also be used.

When the composition for surface treatment contains a surfactant, the lower limit of the content of the surfactant is preferably 0.01 mass % or more, and more preferably 0.05 mass % or more with respect to the total mass of the composition for surface treatment of 100 mass %. Further, the upper limit of the content of the surfactant in the composition for surface treatment is preferably 5 mass % or less and more preferably 1 mass % or less with respect to the total mass of the composition for surface treatment of 100 mass %. Note that when the composition for surface treatment contains two or more types of surfactants, the content of surfactants is intended to be the total amount of these types of surfactant.

<pH of Composition for Surface Treatment>

The pH of the composition for surface treatment according to the present invention is less than 7.0. When the pH of the composition for surface treatment is less than 7.0, the zeta potential on the surface of the silicon nitride film becomes positive. The anionic polymer, which is negatively charged, is adsorbed to the surface of the silicon nitride film by electrostatic attraction, and the number of defects decreases from the viewpoint of surface protection. When the pH of the composition for surface treatment is 7.0 or more, the zeta potential on the surface of the silicon nitride film becomes negative. The anionic polymer electrostatically repulses the silicon nitride film, and is not adsorbed to the silicon nitride film. Therefore, the silicon nitride film is not surface-protected. As a result, the number of defects on the silicon nitride film increases. The pH of the composition for surface treatment is preferably 2 or more and less than 7.0, more preferably 2 or more and 6 or less, further preferably 2.3 or more and 5.5 or less, further more preferably 2.4 or more and less than 5, particularly preferably 2.4 or more and less than 4, and the most preferably 2.4 or more and less than 3.

(pH Adjusting Agent)

The pH of the composition for surface treatment can be adjusted with the above-described chelating agent, but a pH adjusting agent may be further contained.

The pH adjusting agent is not particularly limited, and known pH adjusting agents that are used in the field of the composition for surface treatment can be used, and a known acid, base, or a salt thereof and the like other than the above-described chelating agents can be used. Examples of a pH adjusting agent include organic acids, for example, carboxylic acids such as formic acid, acetic acid, propionic acid, butyric acid, valeric acid, caproic acid, enanthic acid, caprylic acid, pelargonic acid, capric acid, lauric acid, myristic acid, palmitic acid, margaric acid, stearic acid, oleic acid, linoleic acid, linolenic acid, arachidonic acid, docosahexaenoic acid, eicosapentaenoic acid, lactic acid, malic acid, citric acid, benzoic acid, phthalic acid, isophthalic acid, terephthalic acid, salicylic acid, gallic acid, mellitic acid, cinnamic acid, oxalic acid, malonic acid, succinic acid, glutaric acid, adipic acid, fumaric acid, maleic acid, aconitic acid, amino acid, and anthranilic acid, sulfonic acid and organic phosphonic acid; inorganic acids such as nitric acid, carbonic acid, hydrochloric acid, hypophosphorous acid, phosphorous acid, phosphonic acid, boric acid, and hydrofluoric acid; hydroxides of alkali metal such as potassium hydroxide (KOH); carbonates of alkali metal such as potassium carbonate ($K_2CO_3$) and sodium carbonate ($Na_2CO_3$); hydroxides of group 2 elements; ammonia (ammonium hydroxide); and organic bases such as a quaternary ammonium hydroxide compound.

As the pH adjusting agent, a synthetic product thereof may be used and a commercial product thereof may also be used. Further, these pH adjusting agents may be used singly or in combinations of two or more thereof.

The content of the pH adjusting agent in the composition for surface treatment may be appropriately selected from such a content leading to a desired pH value of the composition for surface treatment.

Note that as the pH of the composition for surface treatment, a vale measured by the method described in the Examples is employed.

<Other Additives>

The composition for surface treatment according to an embodiment of the present invention may contain another additive in an arbitrary proportion as necessary to such an extent that the effects of the present invention are not impaired. However, it is desirable to add as little as possible of the components other than the essential components of the composition for surface treatment according to an embodiment of the present invention, as they may cause foreign matter (residue), and no addition of such an additive is desired as far as possible. Examples of other additives include an antifungal agent (antiseptic agent), dissolved gas, a reducing agent, and an oxidizing agent. The composition for surface treatment according to the present invention is acidic. Further, the composition for surface treatment according to the present invention contains polymers. Therefore, the composition for surface treatment according to the present invention preferably contains an antifungal agent (antiseptic agent) among these. The antifungal agent (antiseptic agent) that can be used when the composition for surface treatment according to the present invention contains the antifungal agent (antiseptic agent) is not particularly limited, and can be appropriately selected depending on the polymer type. Specific examples include isothiazoline-based antiseptic agents such as 2-methyl-4-isothiazolin-3-one and 5-chloro-2-methyl-4-isothiazolin-3-one; and phenoxyethanol.

Alternatively, the antifungal agent (antiseptic agent) can be a compound represented by the following chemical formula 1.

[Formula 1]

(Chemical formula 1)

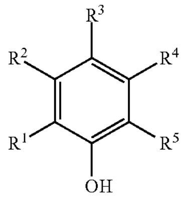

In the chemical formula 1, $R^1$ to $R^5$ is each independently a hydrogen atom or a substituent comprising at least two types of atoms selected from the group consisting of a carbon atom, a hydrogen atom, and an oxygen atom.

Examples of the substituent comprising at least two types of atoms selected from the group consisting of a carbon atom, a hydrogen atom, and an oxygen atom include a hydroxy group, a carboxy group, an alkyl group having 1 or more and 20 or less carbon atoms, a hydroxyalkyl groups having 1 or more and 20 or less carbon atoms, an alkoxy group having 1 or more and 20 or less carbon atoms, a hydroxyalkoxy group having 1 or more and 20 or less carbon atoms, an alkoxycarbonyl group having 2 or more and 21 or less carbon atoms, an aryl group having 6 or more and 30 or less carbon atoms, an aralkyl (arylalkyl) group having 7 or more and 31 or less carbon atoms, an aryloxy group having 6 or more and 30 or less carbon atoms, an aryloxycarbonyl having 6 or more and 30 or less carbon atoms, an aralkyloxycarbonyl having 8 or more and 32 or less carbon atoms, an acyl group having 2 or more and 20 or less carbon atoms, and an acyloxy group having 2 or more and 20 or less carbon atoms.

Further specific examples of the alkyl group having 1 or more and 20 or less carbon atoms include linear alkyl groups such as a methyl group, an ethyl group, a n-propyl group, a n-butyl group, a n-pentyl group, a n-hexyl group, a n-heptyl, a n-octyl group, a n-nonyl group, and a n-decyl; branched alkyl groups such as an isopropyl group, an isobutyl group, a s-butyl group, a t-butyl group, a t-amyl group, a neopentyl group, a 3-methylpentyl group, a 1,1-diethylpropyl group, a 1,1-dimethylbutyl group, a 1-methyl-1-propylbutyl group, a 1,1-dipropylbutyl group, a 1,1-dimethyl-2-methylpropyl group, and a 1-methyl-1-isopropyl-2-methylpropyl group; and cyclic alkyl groups such as a cyclobutyl group, a cyclopentyl group, a cyclohexyl group, a cycloheptyl group, a cyclooctyl group, and a norbornenyl group.

Examples of the hydroxyalkyl group having 1 or more and 20 or less carbon atoms include a hydroxymethyl group, a 2-hydroxyethyl group, a 2-hydroxy-n-propyl group, a 3-hydroxy-n-propyl group, a 2-hydroxy-n-butyl group, a 3-hydroxy-n-butyl group, a 4-hydroxy-n-butyl group, a 2-hydroxy-n-pentyl group, a 3-hydroxy-n-pentyl group, a 4-hydroxy-n-pentyl group, a 5-hydroxy-n-pentyl group, a 2-hydroxy-n-hexyl group, a 3-hydroxy-n-hexyl group, a 4-hydroxy-n-hexyl group, a 5-hydroxy-n-hexyl group, and a 6-hydroxy-n-hexyl group.

Examples of the alkoxy group having 1 or more and 20 or less carbon atoms include linear alkoxy groups such as a methoxy group, an ethoxy group, a n-propyloxy group, a n-butyloxy group, a n-pentyloxy group, a n-hexyloxy group, a n-heptyloxy group, a n-octyloxy group, n-nonyloxy group, and a n-decyloxy group; branched alkoxy groups such as an isopropyloxy group, an isobutyloxy group, a s-butyloxy group, a t-butyloxy group, a t-amyloxy group, a neopentyloxy group, a 3-methylpentyloxy group, a 1,1-diethyl propyloxy group, a 1,1-dimethylbutyloxy group, a 1-methyl-1-propylbutyloxy group, a 1,1-dipropylbutyloxy group, a 1,1-dimethyl-2-methylpropyloxy group, and a 1-methyl-1-isopropyl-2-methylpropyloxy group; and cyclic alkoxy groups such as a cyclobutyloxy group, a cyclopentyloxy group, a cyclohexyloxy group, a cycloheptyloxy group, a cyclooctyloxy group, and a norbornenyloxy group.

Examples of the hydroxy alkoxy group having 1 or more and 20 or less carbon atoms include a hydroxy methoxy group, a 2-hydroxy ethoxy group, a 2-hydroxy-n-propyloxy group, a 3-hydroxy-n-propyloxy group, a 2-hydroxy-n-butyloxy group, a 3-hydroxy-n-butyloxy group, a 4-hydroxy-n-butyloxy group, a 2-hydroxy-n-pentyloxy group, a 3-hydroxy-n-pentyloxy group, a 4-hydroxy-n-pentyloxy group, a 5-hydroxy-n-pentyloxy group, a 2-hydroxy-n-hexyloxy group, a 3-hydroxy-n-hexyloxy group, a 4-hydroxy-n-hexyloxy group, a 5-hydroxy-n-hexyloxy group, and a 6-hydroxy-n-hexyloxy group.

Examples of the alkoxycarbonyl group having 2 or more and 21 or less carbon atoms include a methoxycarbonyl group, an ethoxycarbonyl group, a propoxycarbonyl group, a butoxycarbonyl group, a pentyloxycarbonyl group, a hexyloxycarbonyl group, an octyloxycarbonyl group, and a decyloxycarbonyl group.

Examples of the aryl group having 6 or more and 30 or less carbon atoms include a phenyl group, a naphthyl group, an anthranyl group, and a pyrenyl group.

Examples of the aralkyl group (arylalkyl group) having 7 or more and 31 or less carbon atoms include a benzyl group and a phenethyl group (phenylethyl group). Examples of the aryloxy group having 6 or more and 30 or less carbon atoms include a phenyloxy group (phenoxy group), a naphthyloxy group, an anthranyloxy group, and a pyrenyloxy group.

Examples of the aryloxy carbonyl group having 7 or more and 31 or less carbon atoms include a phenyloxycarbonyl group, a naphthyloxycarbonyl group, an anthranyloxycarbonyl group, and a pyrenyloxycarbonyl group.

Examples of aralkyloxycarbonyl group having 8 or more and 32 or less carbon atoms include a benzyloxycarbonyl group and a phenethyloxycarbonyl group.

Examples of the acyl group having 1 or more and 20 or less carbon atoms include a methanoyl group (formyl group), an ethanoyl group (acetyl group), a propanoyl group, a butanoyl group, a pentanoyl group, a hexanoyl group, an octanoyl group, a decanoyl group, and a benzoyl group.

Examples of the acyloxy group having 1 or more and 20 or less carbon atoms include a formyloxy group, an acetyloxy group, a propanoyloxy group, a butanoyloxy group, a pentanoyloxy group, a hexanoyloxy group, an octanoyloxy group, a decanoyloxy group, and a benzoyloxy group.

Moreover, the antifungal agent represented by the above chemical formula 1 is preferably at least one selected from the group consisting of compounds represented by the following chemical formulae 1-a to 1-c.

[Formula 2]

(Chemical formula 1-a)

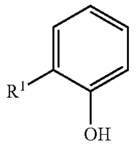

(Chemical formula 1-b)

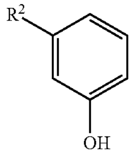

(Chemical formula 1-c)

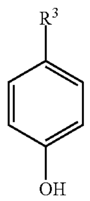

In the chemical formula 1, $R^1$ to $R^3$ are each independently a substituent comprising at least two types of atoms selected from the group consisting of a carbon atom, a hydrogen atom, and an oxygen atom.

Since examples of the substituent comprising at least two types of atoms selected from the group consisting of a carbon atom, a hydrogen atom and an oxygen atom are the same as the above, the description is omitted here.

More specific examples of the compound represented by the above chemical formula 1 include paraoxybenzoic acid esters (parahydroxybenzoic acid esters) such as methyl paraoxybenzoate (methyl parahydroxybenzonate), ethyl paraoxybenzoate (ethyl parahydroxybenzoate), butyl paraoxybenzoate (butyl parahydroxybenzoate), and benzyl paraoxybenzoate (benzyl parahydroxybenzoate); salicylic acid; methyl salicylate; phenol; catechol; resorcinol; hydroquinone; isopropylphenol, cresol; thymol; phenoxyethanol; phenylphenol (2-phenylphenol, 3-phenyl phenol, and 4-phenylphenol); and 2-phenylethyl alcohol (phenethyl alcohol).

Of these, from the viewpoint that the expected effect of the present invention is more effectively exhibited, as the above compound represented by the chemical formula 1, at least one selected from the group consisting of ethyl paraoxybenzoate, butyl paraoxybenzoate and phenylphenol is preferable, and butyl paraoxybenzoate are more preferable.

Alternatively, the antifungal agent (antiseptic agent) can be an unsaturated fatty acid. Examples of the unsaturated fatty acid include monounsaturated fatty acids such as crotonic acid, myristoleic acid, palmitoleic acid, oleic acid, and ricinoleic acid; diunsaturated fatty acids such as sorbic acid, linoleic acid, and eicosadienoic acid; triunsaturated fatty acids such as linolenic acid, pinolenic acid, and eleostearic acid; tetraunsaturated fatty acids such as stearidonic acid and the arachidonic acid; pentaunsaturated fatty acids such as bosseopentaenoic acid and eicosapentaenoic acid; and hexaunsaturated fatty acids such as docosahexaenoic acid and nisinic acid.

Of these, from the viewpoint that the expected effect of the present invention is more effectively exhibited, sorbic acid is preferable as the unsaturated fatty acid.

Besides the above, a compound such as a 1,2-alkanediol such as 1,2-pentanediol, 1,2-hexanediol, or 1,2-octanediol; an alkyl glyceryl ether such as 2-ethylhexyl glyceryl ether (ethylhexylglycerin); capric acid; dehydroacetic acid; or the like may be used as the antifungal agent (antiseptic agent).

The above antifungal agent (antiseptic agent) may be used singly or in combinations of two or more thereof.

The lower limit of the content (concentration) of the antifungal agent (antiseptic agent) when the composition for surface treatment contains the antifungal agent (antiseptic agent) is not particularly limited, but is preferably 0.0001 mass % or more, more preferably 0.001 mass % or more, further preferably 0.005 mass % or more, and particularly preferably 0.01 mass % or more. Further, the upper limit of the content (concentration) of the antifungal agent (antiseptic agent) is not particularly limited, but is preferably 5 mass % or less, more preferably 1 mass % or less, further preferably 0.5 mass % or less, and particularly preferably 0.1 mass % or less. That is, the content (concentration) of the antifungal agent (antiseptic agent) in the composition for surface treatment is preferably 0.0001 mass % or more and 5 mass % or less, more preferably 0.001 mass % or more and 1 mass % or less, further preferably 0.005 mass % or more and 0.5 mass % or less, and particularly preferably 0.01 mass % or more and 0.1 mass % or less. If the content is within such a range, effect enough to inactivate or destroy microbes is obtained. Note that if the composition for surface treatment contains two or more types of antifungal agents (antiseptic agent), the above content is intended to be the total amount thereof.

That is, in an embodiment of the present invention, the composition for surface treatment substantially comprises the nitrogen-free nonionic polymer, the nitrogen-containing nonionic polymer, the anionic polymer, the chelating agent, water, and at least one selected from the group consisting of the antifungal agent, the organic solvent, the surfactant, and the pH adjusting agent. In an embodiment of the present invention, the composition for surface treatment substantially comprises the nitrogen-free nonionic polymer, the nitrogen-containing nonionic polymer, the anionic polymer, the chelating agent, water, and at least one of the antifungal agent and the organic solvent. In an embodiment of the present invention, the composition for surface treatment substantially comprises the nitrogen-free nonionic polymer, the nitrogen-containing nonionic polymer, the anionic polymer, the chelating agent, and water. In the embodiment, the sentence "the composition for surface treatment substantially comprises X." means that the total content of X exceeds 99 mass % (upper limit: 100 mass %) on the basis of the total mass of the composition for surface treatment of 100 mass % (with respect to the composition for surface treatment). The composition for surface treatment preferably consists of X (above total content=100 mass %). For example, the sentence "the composition for surface treatment substantially comprises the nitrogen-free nonionic polymer, the nitrogen-containing nonionic polymer, the anionic polymer, the chelating agent, water, and at least one of the antifungal agent and the organic solvent." means that the total content of the nitrogen-free nonionic polymer, the nitrogen-containing nonionic polymer, the anionic polymer, the chelating agent, water, and the antifungal agent and the organic solvent exceeds 99 mass % (upper limit: 100 mass %) on the basis of the total mass of the composition for surface treatment of 100 mass % (with respect to the composition for surface treatment). The composition for surface treatment preferably consists of the nitrogen-free nonionic polymer, the nitrogen-containing nonionic polymer, the anionic polymer, the chelating agent, water, and at least one of the antifungal agent and the organic solvent (above total content=100 mass %).

In order to further improve the effect of removing foreign matter, the composition for surface treatment of the present invention preferably contains substantially no abrasive grains. Here, the expression, "contains substantially no abrasive grains" refers to a case in which the content of abrasive grains with respect to the entire composition for surface treatment is less than 0.1 mass % (preferably less than 0.01 mass %). That is, in an embodiment, the content of the abrasive grain of the composition for surface treatment of the present invention is less than 0.1 mass % with respect to the composition for surface treatment.

<Method for Producing Composition for Surface Treatment>

For example, the method for producing the composition for surface treatment of the present invention can be obtained by stirring and mixing the nitrogen-free nonionic polymer, the nitrogen-containing nonionic polymer, and the anionic polymer, the solvent, and other components as necessary. The temperature at which each component is mixed is not particularly limited, but is preferably 10° C. or higher and 40° C. or lower, and heating may also be performed to increase the rate of dissolution. Further, the mixing time is also not particularly limited.

<Surface Treatment Method>

Another embodiment of the present invention is a surface treatment method comprising surface-treating a polished object using the above composition for surface treatment. The term "surface treatment method" used herein refers to a method for reducing a residue on a surface of a polished object, and is a cleaning method in a broad term.

With the use of the surface treatment method according to an embodiment of the present invention, residues remaining on a surface of a polished object can be sufficiently removed. Specifically, according to another embodiment of the present invention, provided is a method for reducing a residue on a surface of a polished object, comprising surface-treating a polished object using the above composition for surface treatment. Further, according to another embodiment of the present invention, also provided is a surface treatment method comprising surface-treating a polished object using the above composition for surface treatment, the polished object containing silicon nitride and at least one selected from the group consisting of silicon oxide and polysilicon, to reduce a residue on a surface of the polished object.

The surface treatment method according to an embodiment of the present invention is performed by a method that includes bringing the composition for surface treatment according to the present invention into direct contact with a polished object.

Examples of the surface treatment method mainly include (I) a method based on rinse polishing treatment, and (II) a method based on cleaning treatment. Specifically, according to an embodiment of the present invention, the above surface treatment is preferably performed by rinse polishing treatment or cleaning treatment. That is, the above surface treatment method is preferably a rinse polishing treatment method or a cleaning treatment method. Rinse polishing treatment and cleaning treatment are performed for removing foreign matter on a surface of a polished object (particles, metallic contamination, organic residues, pad debris etc.), so as to obtain a clean surface. (I) and (II) above are described as follows.

(I) Rinse Polishing Treatment

The composition for surface treatment according to the present invention is suitably used in rinse polishing treatment. Specifically, the composition for surface treatment according to an embodiment of the present invention can be preferably used as a rinse polishing composition. The rinse polishing treatment is performed on a platen (turn table platen) with a polishing pad attached thereto, after final polishing (finish polishing) of an object to be polished, in order to remove foreign matter on a surface of an object to be polished. At this time, the composition for surface treatment according to the present invention is brought into direct contact with the polished object, thereby performing rinse polishing treatment. As a result, foreign matter on the surface of the polished object is removed by frictional force (physical action) applied by the polishing pad and chemical action applied by the composition for surface treatment. Of foreign matter, particularly particles and organic residues are easily removed by physical action. Therefore, in the rinse polishing treatment, through the use of friction with the polishing pad on the platen, particles and organic residues can be effectively removed.

Specifically, the terms "rinse polishing treatment", "rinse polishing method" and "rinse polishing step" used herein refer to, treatment, a method and a step of reducing residues on a surface of an object to be surface-treated with the use of a polishing pad, respectively.

Specifically, the rinse polishing treatment can be performed by placing, after the polishing step, the surface of the polished object on a platen of a polishing apparatus, bringing the polishing pad and the polished semiconductor substrate into contact with each other, and then sliding the polished object and the polishing pad relative to each other while feeding the composition for surface treatment to the contact portion.

As a polishing apparatus, it is possible to use a general polishing apparatus including a holder for holding an object to be polished and a motor or the like having a changeable rotational speed fitted thereto, and a platen to which a polishing pad (polishing cloth) can be attached.

The rinse polishing treatment can also be performed using any of a one-side polishing apparatus and a double-side polishing apparatus. Further, the above polishing apparatus is preferably provided with, in addition to a discharge nozzle for discharging the polishing composition, a discharge nozzle for discharging the composition for surface treatment. Operation conditions for rinse polishing treatment of the polishing apparatus are not particularly limited, and can be appropriately set by persons skilled in the art.

As the polishing pad, a general nonwoven fabric, polyurethane, a porous fluororesin, or the like can be used without any particular limitation. The polishing pad is preferably grooved such that a composition for surface treatment can be stored therein.

Rinse polishing conditions are also not particularly limited. For example, the rotational speed of a platen, and the rotational speed of a head (carrier) are each preferably 10 rpm (0.17 $s^{-1}$) or more and 100 rpm (1.67 $s^{-1}$) or less, and pressure (polishing pressure) to be applied to a polished object is preferably 0.5 psi (3.4 kPa) or more and 10 psi (68.9 kPa) or less. A method for feeding the composition for surface treatment to a polishing pad is also not particularly limited. For example, a method for continuously feeding the composition using a pump or the like (discarded after single use) is employed. The feed rate is not limited, but a surface of the polishing pad is preferably covered all the time with the composition for surface treatment, and is preferably 10 mL/minute or more and 5000 mL/minute or less. The rinse polishing time is not particularly limited, either. However, the time is preferably 5 or more seconds and 180 or less seconds.

After rinse polishing treatment using the composition for surface treatment according to an embodiment of the present invention, the polished object (object to be surface treated) is preferably lifted up and removed while being applied with the composition for surface treatment according to an embodiment of the present invention.

(II) Cleaning Treatment

The composition for surface treatment according to the present invention may also be used in cleaning treatment. Specifically, the composition for surface treatment according to an embodiment of the present invention can be preferably used as a cleaning composition. Cleaning treatment is preferably performed for removing foreign matter on a surface of a polished object (object to be cleaned) after final polishing (finish polishing) of an object to be polished, after the above rinse polishing treatment, or after another rinse polishing treatment using a rinse polishing composition other than the composition for surface treatment of the present invention. Note that the cleaning treatment and the above rinse polishing treatment are classified based on locations where these treatments are performed. The cleaning treatment is preferably surface treatment that is performed at a location not on a platen and is performed after removal of the polished object from the platen. In such cleaning treatment, the composition for surface treatment according to the present invention is brought into direct contact with a polished object so as to be able to remove foreign matter on the surface of the object.

Examples of a method for performing cleaning treatment include (i) a method that includes bringing a cleaning brush into contact with one side or both sides of a polished object while holding the polished object, and then running the cleaning brush over the surface of an object to be cleaned while feeding the composition for surface treatment to the contact portion, and (ii) a method (dipping mode) that includes immersing a polished object in the composition for surface treatment, and then performing ultrasonic treatment or stirring. With the use of such a method, foreign matter on a surface of a polished object is removed by frictional force applied by a cleaning brush or mechanical force that is generated by ultrasonic treatment or stirring, and chemical action applied by the composition for surface treatment.

In the above method (i), a method for bringing the composition for surface treatment into contact with a polished object, is not particularly limited, and examples thereof include a spinning mode whereby a polished object is rotated at a high speed while the composition for surface treatment is poured from a nozzle onto the polished object, and the spraying mode whereby the composition for surface treatment is sprayed to a polished object to clean the object.

From the viewpoint of being capable of more efficiently performing decontamination within a short time, the cleaning treatment preferably employs the spinning mode or the spraying mode, and the same further preferably employs the spinning mode.

Examples of an apparatus for performing such cleaning treatment include a batch-type cleaning apparatus by which a plurality of polished objects housed in a cassette are surface-treated simultaneously, and a single wafer processing-type cleaning apparatus, by which, a sheet of a polished object is held by a holder for surface treatment. From the viewpoint of shortening of cleaning time or the like, a method that includes the use of a single wafer processing-type cleaning apparatus is preferable.

Furthermore, an example of an apparatus for performing cleaning treatment is a polishing apparatus provided with a cleaning facility, by which a polished object is scrubbed with a cleaning brush after the polished object is removed from a platen. Through the use of such polishing apparatuses, cleaning treatment can be more efficiently performed for polished objects.

As such a polishing apparatus, it is possible to use a general polishing apparatus including a holder for holding a polished object, a motor having a changeable rotational speed, a cleaning brush, and the like. As a polishing apparatus, any of a one-side polishing apparatus and a double-side polishing apparatus may also be used. Note that when a rinse polishing step is performed after the CMP step, it is more efficient and preferable to perform the cleaning treatment using the same apparatus as that in the rinse polishing step.

The cleaning brush is not particularly limited, but is preferably a resin brush (brush made of resin). The material of the resin brush is not particularly limited, but is preferably PVA (polyvinyl alcohol). The cleaning brush is more preferably a PVA sponge (sponge made of PVA).

Cleaning conditions are also not particularly limited, and can be appropriately set in accordance with the type of an object to be surface-treated (polished object), as well as the type and the amount of residues to be removed. For example, the rotational speed of the cleaning brush is preferably 10 rpm (0.17 $s^{-1}$) or more and 200 rpm (3.33 $s^{-1}$) or less, and the rotational speed of an object to be cleaned is preferably 10 rpm (0.17 $s^{-1}$) or more and 100 rpm (1.67 $s^{-1}$) or less. Pressure (polishing pressure) to be applied to an object to be surface-treated (polished object) is preferably 0.5 psi (3.4 kPa) or more and 10 psi (68.9 kPa) or less. A method for feeding the composition for surface treatment to a cleaning brush is also not particularly limited. For example, a method for continuously feeding the composition using a pump or the like (discarded after single use) is employed. The feed rate is not limited, but a cleaning brush and a surface of an object to be cleaned are preferably covered all the time with the composition for surface treatment, and is preferably 10 mL/minute or more and 5000 mL/minute or less. The cleaning time is also not particularly limited, but the time for a step using the composition for surface treatment according to an embodiment of the present invention is preferably 5 or more seconds and 180 or less seconds. When the cleaning time is within such range, foreign matter can be more effectively removed.

The temperature of the composition for surface treatment upon cleaning is not particularly limited, and may be generally room temperature. As long as the performance is not impaired, the temperature may also be increased to about 40° C. or higher and 70° C. or lower.

In the above method (ii), conditions for a cleaning method that includes immersion are not particularly limited, and a known technique can be used.

Before surface treatment is performed according to the above method (I) or (II), cleaning with water may also be performed.

(Post-Cleaning Treatment)

Further, a surface treatment method preferably includes further cleaning of the polished object by cleaning treatment after surface treatment of (I) or (II) above using the composition for surface treatment according to an embodiment of the present invention. This "cleaning treatment" used herein is referred to as post-cleaning treatment. Examples of the post-cleaning treatment include, but are not particularly limited to, a method that includes simply pouring water over an object to be surface-treated, and a method that includes simply immersing an object to be surface-treated in water. Further examples thereof include a method (brush cleaning) that includes, in the manner same as in surface treatment according to the above-described method (II), bringing a cleaning brush into contact with the one side or both sides of an object to be surface-treated, while holding the object to be surface-treated, and then scrubbing the surface(s) of the object to be surface-treated with the cleaning brush while feeding water or a solution (for example, $NH_3$ solution) to the contact portion or while feeding water and a solution (for example, $NH_3$ solution) to the contact portion in any order (feeding water and then feeding the solution, or feeding the solution and then feeding water), and a method (dipping mode) that includes immersing an object to be surface-treated in water, and then performing ultrasonic treatment and stirring. Of these methods, the preferable method includes bringing a cleaning brush into contact with the one side or both sides of an object to be surface-treated while holding the object to be surface-treated, and then scrubbing the surface(s) of the object to be surface-treated with cleaning brush while feeding water or a solution (for example, $NH_3$ solution) to the contact portion or feeding water and a solution (for example, $NH_3$ solution) in any order (feeding water and then feeding the solution, or feeding the solution and then feeding water) to the contact portion. Note that regarding apparatuses and conditions of the post-cleaning treatment, the description of the surface treatment of (II) above can be referred to. Here, as water to be used for the post-cleaning treatment, particularly deionized water is preferably used.

Surface treatment is performed using the composition for surface treatment according to an embodiment of the present invention, so that residues are exceedingly easily removed. Accordingly, surface treatment is performed using the composition for surface treatment according to the surface treatment of an embodiment of the present invention, and then further cleaning treatment is performed using water, so that residues are removed extremely well.

Further, a polished object (object to be surface-treated) after surface treatment or after post-cleaning is preferably dried by removing water droplets adhered onto the surface (s) using a spin dryer or the like. Moreover, the surface(s) of an object to be surface-treated may also be dried by air-blow drying.

<Method for Producing Semiconductor Substrate>

The surface treatment method according to an embodiment of the present invention is suitably applied when a polished object is a polished semiconductor substrate. Specifically, according to another embodiment of the present invention, a method for producing a semiconductor substrate is also provided, wherein a polished object is a polished semiconductor substrate, and residues on the surface of the polished semiconductor substrate are reduced by the above surface treatment method. Accordingly, according to the present invention, provided is a method for producing a semiconductor substrate, wherein the polished object is a polished semiconductor substrate, the method comprising: a polishing step of polishing a semiconductor substrate before polishing using the polishing composition containing abrasive grains, the semiconductor substrate before polishing containing at least one selected from the group consisting of silicon oxide, polysilicon, and silicon nitride, to obtain the polished semiconductor substrate; and a surface treatment step of reducing a residue containing the abrasive grains on the surface of the polished semiconductor substrate using the above composition for surface treatment.

Detailed descriptions of a semiconductor substrate, to which such a production method is applied, are the same as given for a polished object that is surface-treated with the above composition for surface treatment.

Further the method for producing a semiconductor substrate is not particularly limited, as long as it comprises a step of surface-treating (surface treatment step) a surface of a polished semiconductor substrate using the composition for surface treatment according to an embodiment of the present invention. An example of such a production method is a method having a polishing step and a cleaning step for forming a polished semiconductor substrate. Another example thereof is a method having a rinse polishing step between a polishing step and a cleaning step, in addition to the polishing step and the cleaning step. Each of these steps is as described below.

[Polishing Step]

A polishing step that can be included in a method for producing a semiconductor substrate is a step for polishing a semiconductor substrate, so as to form a polished semiconductor substrate.

The polishing step is not particularly limited, as long as it is a step for polishing a semiconductor substrate, but the polishing step is preferably a Chemical Mechanical Polishing (CMP) step. Further, the polishing step may comprise a single process or a plurality of processes. Examples of the polishing step comprising a plurality of processes include a polishing step wherein a preliminary polishing process (rough polishing process) is performed and then a finish polishing process is performed, and a polishing step wherein a primary polishing process is performed, a secondary polishing process is performed once or two or more times, and then a finish polishing process is performed. The surface treatment step using the composition for surface treatment according to the present invention is preferably performed after the above finish polishing process.

As the polishing composition, a known polishing composition can be appropriately used in accordance with the property of a semiconductor substrate. The polishing composition is not particularly limited, but for example, the polishing composition containing abrasive grains, a solvent, a pH adjusting agent, and an electrical conductivity adjusting agent can be preferably used. Specific examples of such a polishing composition include a polishing composition containing silicon oxide (for example, anion-modified colloidal silica), maleic acid, ammonium sulfate, and water. Further, the pH of the polishing composition is preferably 2 or more and 6 or less.

The abrasive grains may be any of inorganic particles, organic particles, and organic-inorganic composite particles. Specific examples of the inorganic particles include particles comprising a metallic oxide such as silicon oxide, alumina, ceria, or titania; silicon nitride particles; silicon carbide particles; and boron nitride particles. Specific examples of the organic particles include polymethyl methacrylate (PMMA) particles. Further, as the abrasive grains, commercial products thereof or synthetic products thereof may also be used. Moreover, the abrasive grains may be surface-modified. The abrasive grains may be used singly or in combinations of two or more thereof.

The lower limit of the average primary particle size of the abrasive grains is preferably 10 nm or more, more preferably 15 nm or more, further preferably 20 nm or more, and further preferably 30 nm or more. If the lower limit is within such a range, high polishing speed can be maintained, the abrasive grains can therefore be suitably used in the rough polishing process. Further, the upper limit of the average primary particle size of the abrasive grains is preferably 200 nm or less, more preferably 150 nm or less, and further preferably 100 nm or less. In some aspects, the average primary particle size may be 75 nm or less, 60 nm or less, or 50 nm or less. If the average primary particle size is within such a range, defect production on the surface of the object to be polished after the polishing can be further controlled. Note that, for example, the average primary particle size of the abrasive grains is calculated based on the specific surface area of the abrasive grains measured by the BET method.

The lower limit of the average secondary particle size of the abrasive grains is preferably 15 nm or more, more preferably 30 nm or more, further preferably 40 nm or more, further more preferably 50 nm or more, and particularly preferable 60 nm or more. If the lower limit is within such a range, high polishing speed can be maintained. Further, the upper limit of the average secondary particle size of the abrasive grains is preferably 300 nm or less, more preferably 200 nm or less, further preferably 150 nm or less, further more preferably 100 nm or less, and particularly preferably 80 nm or less. If the upper limit is within such a range, defect production on the surface of the object to be polished after the polishing can be further controlled. The average secondary particle size of the abrasive grains can be measured by dynamic light scattering. For example, the average secondary particle size can be measured using the model "FPAR-1000" manufactured by Otsuka Electronics Co., Ltd. or a counterpart thereof.

When the polishing composition is used as a polishing liquid as it is, the content of the abrasive grains is preferably 0.1 mass % or more, more preferably 0.4 mass % or more, and further preferably 1.0 mass % or more with respect to the polishing composition. An increase in the content of the abrasive grains improves the polishing speed. Further, when polishing composition is used as the polishing liquid as it is, from the viewpoint of scratch prevention and the like, the content of the abrasive grains is usually and suitably 10 mass % or less, preferably 5 mass % or less, more preferably 3 mass % or less, and further preferably 2 mass % or less. It is also preferable to reduce the content of the abrasive grains from the viewpoint of economic efficiency. Note that when two or more types of abrasive grains are used in combination, the above content refers to the total content of the two or more types of abrasive grains.

Since the pH adjusting agent and the solvent are the same as specified in the above items (pH adjusting agent) and (solvent), the description is omitted here.

The electrical conductivity adjusting agent functions so as to enhance the polishing promotion effect synergistically or improve the dispersion stability of the polishing composition by adjusting the electrical conductivity of the polishing composition to a suitable range. As long as the electrical conductivity adjusting agent is a compound having the function of adjusting the electrical conductivity, the electrical conductivity adjusting agent is not particularly limited. Examples thereof include salt compounds such as nitrates such as potassium nitrate and ammonium nitrate; phosphates such as diammonium hydrogen phosphate, ammonium dihydrogen phosphate; and sulfates such as ammonium sulfate. The amount of the electrical conductivity adjusting agent to be added (the concentration of the electrical conductivity adjusting agent) is appropriately adjusted and selected to be a desired electrical conductivity of the polishing composition.

As a polishing apparatus, it is possible to use a general polishing apparatus including a holder for holding an object to be polished and a motor or the like having a changeable rotational speed fitted thereto, and a platen to which a polishing pad (polishing cloth) can be attached. As a polishing apparatus, any of a one-side polishing apparatus and a double-side polishing apparatus may also be used.

As the polishing pad, a general nonwoven fabric, polyurethane, a porous fluororesin, or the like can be used without any particular limitation. The polishing pad is preferably grooved such that a polishing liquid can be stored therein.

Polishing conditions are also not particularly limited, either. For example, the rotational speed of a platen and the rotational speed of a head are each preferably 10 rpm (0.17 $s^{-1}$) or more and 100 rpm (1.67 $s^{-1}$) or less, and the pressure (polishing pressure) applied to an object to be polished is preferably 0.5 psi (3.4 kPa) or more and 10 psi (68.9 kPa) or less. A method for feeding a polishing composition to a polishing pad is not particularly limited, either. For example, a method that includes feeding a polishing composition continuously using a pump or the like can be employed (discarded after single use). The feed rate is not limited, but a surface of the polishing pad is preferably covered all the time with the polishing composition, and it is preferably 10 mL/minute or more and 5000 mL/minute or less. The polishing time is also not particularly limited, either. However, for the step of using the polishing composition, it is preferably 5 seconds or more and 180 seconds or less.

[Surface Treatment Step]

The surface treatment step refers to a step of reducing residues on a surface of a polished object using the composition for surface treatment according to the present invention. In a method for producing a semiconductor substrate, after a rinse polishing step, a cleaning step as the surface treatment step may be performed, the rinse polishing step alone or the cleaning step alone may be performed.

(Rinse Polishing Step)

The rinse polishing step may be provided between the polishing step and the cleaning step in the method for producing a semiconductor substrate. The rinse polishing step is a step for reducing foreign matter on a surface of a polished object (polished semiconductor substrate) by the surface treatment method (rinse polishing treatment method) according to an embodiment of the present invention.

Detailed descriptions of a rinse polishing method employed in the rinse polishing step are as given for the above rinse polishing treatment.

(Cleaning Step)

The cleaning step may be provided following the polishing step or the rinse polishing step in a method for producing a semiconductor substrate. The cleaning step is a step for reducing foreign matter on a surface of a polished object (polished semiconductor substrate) by the surface treatment method (cleaning method) according to an embodiment of the present invention.

Detailed descriptions for a cleaning method employed in the cleaning step are as given for the above cleaning method.

The embodiments of the present invention are described in detail above, but are explanatory and illustrative only, and are not limited. The scope of the present invention should be obviously construed on the basis of the attached claims.

The present invention includes the following aspects and embodiments.

1. A composition for surface treatment, comprising: a nitrogen-free nonionic polymer, a nitrogen-containing nonionic polymer, and an anionic polymer, wherein the nitrogen-free nonionic polymer has a weight-average molecular weight of less than 100,000, a ratio of a weight-average molecular weight of the nitrogen-containing nonionic polymer to the weight-average molecular weight of the nitrogen-free nonionic polymer (nitrogen-containing nonionic polymer/nitrogen-free nonionic polymer) is 0.1 or more and 10 or less, and the composition for surface treatment has a pH of less than 7.0.

2. The composition for surface treatment according to the above 1, wherein the nitrogen-containing nonionic polymer has an amide bond.

3. The composition for surface treatment according to the above 1 or 2, wherein the nitrogen-containing nonionic polymer has a weight-average molecular weight of 80,000 or less.

4. The composition for surface treatment according to any one of the above 1 to 3, wherein the nitrogen-containing nonionic polymer is one or more selected from the group consisting of polyvinylpyrrolidone, poly-N-vinylacetamide, polydimethylacrylamide, polyvinyl caprolactam, N-isopropylacrylamide, and oxazoline group-containing polymers.

5. The composition for surface treatment according to any of the above 1 to 4, wherein a ratio of a weight-average molecular weight of the nitrogen-containing nonionic polymer to a weight-average molecular weight of the nitrogen-free nonionic polymer (nitrogen-containing nonionic polymer/nitrogen-free nonionic polymer) is 0.1 or more and 8 or less.

6. The composition for surface treatment according to any one of the above 1 to 5, wherein the nitrogen-free nonionic polymer is polyvinyl alcohol.

7. The composition for surface treatment according to any one of the above items 1 to 6, further comprising a chelating agent having two or more phosphoric acid groups.

8. The composition for surface treatment according to the above 7, comprising substantially no abrasive grains.

9. A surface treatment method, comprising surface-treating a polished object using the composition for surface treatment according to any one of the above 1 to 8, the polished object comprising at least one selected from the group consisting of silicon oxide, polysilicon, and silicon nitride, to reduce a residue on a surface of the polished object.

10. The surface treatment method according to the above 9, wherein the surface treatment method is a rinse polishing treatment method or a cleaning treatment method.

11. A method for producing a semiconductor substrate, wherein a polished object is a polished semiconductor substrate, the method comprising: a polishing step of polishing a semiconductor substrate before polishing using a polishing composition comprising abrasive grains, the semiconductor substrate before polishing comprising at least one selected from the group consisting of silicon oxide, polysilicon, and silicon nitride, to obtain the polished semiconductor substrate; and a surface treatment step of reducing a residue comprising the abrasive grains on a surface of the polished semiconductor substrate using the composition for surface treatment according to any one of the above 1 to 8.

12. The method for producing a semiconductor substrate according to the above 11, wherein the polishing composition has a pH of 2 or more and 6 or less.

EXAMPLES

The present invention will be described in more detail using the following Examples and Comparative Examples, but the technical scope of the present invention is not limited to only the following Examples. Note that unless otherwise specified, "%" and "part(s)" refer to "mass %" and "parts by mass", respectively. Further, in the following Examples, unless otherwise specified, operation was performed under conditions of room temperature (25° C.)/relative humidity of 40% RH or more and 50% RH or less.

[Polymer Preparations]

The following nitrogen-free nonionic polymers, nitrogen-containing nonionic polymers, and anionic polymers were prepared.

"Nitrogen-Free Nonionic Polymer"

Polyvinyl Alcohol (x1) JMR-3HH (JAPAN VAM & POVAL CO., LTD.); Weight-average molecular weight: 5,000

(x2) JMR-10HH (JAPAN VAM & POVAL CO., LTD.); Weight-average molecular weight: 10,000

(x3) DENKA POVAL K-05 (Denka Company Limited); Weight-average molecular weight: 22,000

"Nitrogen-Containing Nonionic Polymer"

Polyvinylpyrrolidone (a1) PITZCOL K17L (DKS Co. Ltd.); Weight-average molecular weight: 9,000

(a2) PITZCOL K30A (DKS Co. Ltd.); Weight-average molecular weight: 45,000

(a3) PITZCOL K50 (DKS Co. Ltd.); Weight-average molecular weight 250,000

Polydimethylacrylamide (b) Poly(N,N-dimethylacrylamide) (Merck KGaA); Weight-average molecular weight: 10,000

Poly-N-vinylacetamide (c1) PNVA GE191-107 (Resonac Holdings Corporation); Weight-average molecular weight: 50,000

(c2) PNVA GE191-104 (Resonac Holdings Corporation); Weight-average molecular weight: 300,000

(c3) PNVA GE191-103 (Resonac Holdings Corporation); Weight-average molecular weight: 9000,000

Poly-N-isopropylacrylamide (d) Poly(N-isopropylacrylamide) (Merck KGaA); Weight-average molecular weight: 40,000

Oxazoline Group-Containing Polymer (e) EPOCROS WS-700 (NIPPON SHOKUBAI CO., LTD.); Weight-average molecular weight: 40,000

Poly-N-vinylcaprolactam (f) Luviskol Plus (BASF); Weight-average molecular weight: 70,000

"Anionic Polymer"

Sodium salt of copolymer of acrylic acid and 2-acrylamide-2-methylpropanesulfonic acid (hereinafter referred to as a "(acrylic acid/sulfonic acid) copolymer") (product name: ARON A-6012 (TOAGOSEI CO., LTD.)); Weight-average molecular weight: 12,000

The weight-average molecular weights of the above polymers were measured by the following method.

[Measurement of Weight-Average Molecular Weight (Mw) of Polymer]

As the weight-average molecular weights (Mw) of the polymers, the values of the weight-average molecular weights (in terms of polyethylene glycol) measured by gel permeation chromatography (GPC) were used. The weight-average molecular weights were measured using the following apparatuses and conditions:

GPC apparatus: manufactured by SHIMADZU CORPORATION

Model: Prominence+ELSD detector (ELSD-LTII)

Column: VP-ODS (manufactured by SHIMADZU CORPORATION)

Mobile phase A: MeOH

B: Aqueous solution of acetic acid 1% aqueous solution

Flow rate: 1 mL/min

Detector: ELSD temp. 40° C., Gain 8, $N_2$GAS 350 kPa

Oven temperature: 40° C.

Amount injected: 40 μL.

[Measurement of pH of Composition for Surface Treatment]

The pH of the composition for surface treatment (liquid temperature: 25° C.) was confirmed using a pH meter (manufactured by HORIBA, Ltd., Product name: LAQUA (registered trademark)).

[Preparation of Composition for Surface Treatment]

Example 1

A composition for surface treatment A1 was prepared by stirring and mixing polyvinyl alcohol having a weight-average molecular weight of 22,000 as a nitrogen-free nonionic polymer, poly-N-vinylacetamide having a weight-average molecular weight of 9,000 as a nitrogen-containing nonionic polymer, the (acrylic acid/sulfonic acid) copolymer having a weight-average molecular weight of 12,000 as an anionic polymer, water (deionized water) as a solvent, and 1-hydroxyethane-1,1-diphosphonic acid (hereinafter referred to as "HEDP") (product name: Dequest 2010EL (Italmatch Japan Ltd.)) as a chelating agent at 25° C. for 5 minutes.

Here, the content of the nitrogen-free nonionic polymer was 0.1 mass % with respect to the total mass of the composition for surface treatment A1. The content of the nitrogen-containing nonionic polymer was 0.1 mass % with respect to the total mass of the composition for surface treatment A1. The content of the anionic polymer was 0.01 mass % with respect to the total mass of the composition for surface treatment A1. The content of the chelating agent was an amount wherein the pH of the composition for surface treatment A1 was 2.5 (0.02 mass % with respect to the total mass of the composition for surface treatment A1).

Examples 2 to 24 and Comparative Examples 1 to 35

Except for changing the types and/or the contents of the nitrogen-free nonionic polymer, the nitrogen-containing nonionic polymer, and the anionic polymer as described in the following Tables 1A to 1D, compositions for surface treatment A2 to A24 and compositions for surface treatment B1 to B35 were prepared in the same manner as in Example 1. In the compositions for surface treatment A10 and A12 of Examples 10 and 12 and the compositions for surface treatment B28 to B31 of Comparative Examples 28 to 31, the chelating agent was added in amounts described in Table 1A and Table 1C, and the pHs were adjusted to pHs described in Table 1A and Table 1C using ammonia in addition. Note that, in Comparative Examples 10 to 13, polyethylene glycol (PEG) or polypropylene glycol (PPG) was used as a nitrogen-free nonionic polymer.

In Tables 1A to 1D and the later-described Tables 2A to 2D, the nitrogen-containing (nitrogen-free) nonionic polymer was expressed as an "N-containing (N-free) nonionic polymer", the (acrylic acid/sulfonic acid) copolymer was expressed as an "AA/SA copolymer", and polyvinyl alcohol was expressed as "PVA". Further, in Tables 1A to 1D and the later-described Tables 2A to 2D, "the molecular weight ratio of N-containing/N-free" refers to "the ratio of the weight-average molecular weight of the N-containing nonionic polymer/the weight-average molecular weight of N-free nonionic polymer".

TABLE 1A

| | N-free nonionic polymer | | | N-containing nonionic polymer | | |
|---|---|---|---|---|---|---|
| | Compound | Molecular weight | Content [mass %] | Compound | Molecular weight | Content [mass %] |
| Example 1 | PVA | 22000 | 0.10 | Polyvinylpyrrolidone | 9000 | 0.10 |
| Example 2 | PVA | 10000 | 0.10 | Polyvinylpyrrolidone | 9000 | 0.10 |
| Example 3 | PVA | 10000 | 0.10 | Polydimethylacrylamide | 10000 | 0.10 |
| Example 4 | PVA | 5000 | 0.10 | Polyvinylpyrrolidone | 9000 | 0.10 |
| Example 5 | PVA | 22000 | 0.10 | Polyvinylpyrrolidone | 45000 | 0.10 |
| Example 6 | PVA | 22000 | 0.10 | Poly-N-vinylacetamide | 50000 | 0.10 |
| Example 7 | PVA | 10000 | 0.10 | Poly-N-isopropylacrylamide | 40000 | 0.10 |

TABLE 1A-continued

| | | | | | | |
|---|---|---|---|---|---|---|
| Example 8 | PVA | 10000 | 0.10 | Oxazoline group-containing polymer | 40000 | 0.10 |
| Example 9 | PVA | 10000 | 0.10 | Polyvinylpyrrolidone | 45000 | 0.10 |
| Example 10 | PVA | 10000 | 0.10 | Polyvinylpyrrolidone | 45000 | 0.10 |
| Example 11 | PVA | 10000 | 0.10 | Poly-N-vinylacetamide | 50000 | 0.10 |
| Example 12 | PVA | 10000 | 0.10 | Poly-N-vinylacetamide | 50000 | 0.10 |
| Example 13 | PVA | 10000 | 0.10 | Poly-N-vinylcaprolactam | 70000 | 0.10 |
| Example 14 | PVA | 5000 | 0.10 | Polyvinylpyrrolidone | 45000 | 0.10 |
| Example 15 | PVA | 5000 | 0.10 | Poly-N-vinylacetamide | 50000 | 0.10 |
| Example 16 | PVA | 10000 | 0.01 | Poly-N-vinylacetamide | 50000 | 0.10 |
| Example 17 | PVA | 10000 | 0.10 | Poly-N-vinylacetamide | 50000 | 0.01 |
| Example 18 | PVA | 22000 | 0.01 | Polyvinylpyrrolidone | 9000 | 0.01 |

| | Anionic polymer AA/SA Copolymer Molecular weight 12000 | Chelating agent | | Molecular weight ratio of N- | |
|---|---|---|---|---|---|
| | Content [mass %] | Compound | Content [mass %] | containing/ N-free | pH |
| Example 1 | 0.01 | HEDP | 0.02 | 0.4 | 2.5 |
| Example 2 | 0.01 | HEDP | 0.02 | 0.9 | 2.5 |
| Example 3 | 0.01 | HEDP | 0.02 | 1.0 | 2.5 |
| Example 4 | 0.01 | HEDP | 0.02 | 1.8 | 2.5 |
| Example 5 | 0.01 | HEDP | 0.02 | 2.0 | 2.5 |
| Example 6 | 0.01 | HEDP | 0.02 | 2.3 | 2.5 |
| Example 7 | 0.01 | HEDP | 0.02 | 4.0 | 2.5 |
| Example 8 | 0.01 | HEDP | 0.02 | 4.0 | 2.5 |
| Example 9 | 0.01 | HEDP | 0.02 | 4.5 | 2.5 |
| Example 10 | 0.01 | HEDP | 0.02 | 4.5 | 3.5 |
| Example 11 | 0.01 | HEDP | 0.02 | 5.0 | 2.5 |
| Example 12 | 0.01 | HEDP | 0.02 | 5.0 | 3.5 |
| Example 13 | 0.01 | HEDP | 0.02 | 7.0 | 2.5 |
| Example 14 | 0.01 | HEDP | 0.02 | 9.0 | 2.5 |
| Example 15 | 0.01 | HEDP | 0.02 | 10.0 | 2.5 |
| Example 16 | 0.01 | HEDP | 0.02 | 5.0 | 2.5 |
| Example 17 | 0.01 | HEDP | 0.02 | 5.0 | 2.5 |
| Example 18 | 0.01 | HEDP | 0.02 | 0.4 | 2.5 |

TABLE 1B

| | N-free nonionic polymer | | | N-containing nonionic polymer | | |
|---|---|---|---|---|---|---|
| | Compound | Molecular weight | Content [mass %] | Compound | Molecular weight | Content [mass %] |
| Example 19 | PVA | 10000 | 0.20 | Poly-N-vinylacetamide | 50000 | 0.10 |
| Example 20 | PVA | 10000 | 0.10 | Poly-N-vinylacetamide | 50000 | 0.20 |
| Example 21 | PVA | 10000 | 0.20 | Poly-N-vinylacetamide | 50000 | 0.20 |
| Example 22 | PVA | 10000 | 0.01 | Poly-N-vinylacetamide | 50000 | 0.20 |
| Example 23 | PVA | 10000 | 0.20 | Poly-N-vinylacetamide | 50000 | 0.01 |
| Example 24 | PVA | 10000 | 0.10 | Poly-N-vinylacetamide | 50000 | 0.10 |
| Comparative Example 1 | PVA | 10000 | 0.10 | Poly-N-vinylacetamide | 50000 | 0.10 |
| Comparative Example 2 | PVA | 10000 | 0.10 | Poly-N-vinylacetamide | 300000 | 0.10 |
| Comparative Example 3 | PVA | 10000 | 0.10 | Poly-N-vinylacetamide | 900000 | 0.10 |
| Comparative Example 4 | PVA | 10000 | 0.10 | Polyvinylpyrrolidone | 250000 | 0.10 |
| Comparative Example 5 | PVA | 5000 | 0.10 | Poly-N-vinylacetamide | 300000 | 0.10 |
| Comparative Example 6 | PVA | 5000 | 0.10 | Poly-N-vinylacetamide | 900000 | 0.10 |
| Comparative Example 7 | PVA | 6000 | 0.10 | Polyvinylpyrrolidone | 250000 | 0.10 |
| Comparative Example 8 | PVA | 22000 | 0.10 | Poly-N-vinylacetamide | 300000 | 0.10 |
| Comparative Example 9 | PVA | 22000 | 0.10 | Poly-N-vinylacetamide | 900000 | 0.10 |
| Comparative Example 10 | PEG | 22000 | 0.10 | Polyvinylpyrrolidone | 250000 | 0.10 |
| Comparative Example 11 | PEG | 200 | 0.10 | Polyvinylpyrrolidone | 45000 | 0.10 |
| Comparative Example 12 | PPG | 600 | 0.10 | Polyvinylpyrrolidone | 45000 | 0.10 |

TABLE 1B-continued

| | | | | | | |
|---|---|---|---|---|---|---|
| Comparative Example 13 | PPG | 400 | 0.10 | Polyvinylpyrrolidone | 45000 | 0.10 |

| | Anionic polymer AA/SA Copolymer Molecular weight 12000 | Chelating agent | | Molecular weight ratio of N- | |
|---|---|---|---|---|---|
| | Content [mass %] | Compound | Content [mass %] | containing/ N-free | pH |
| Example 19 | 0.01 | HEDP | 0.02 | 5.0 | 2.5 |
| Example 20 | 0.01 | HEDP | 0.02 | 5.0 | 2.5 |
| Example 21 | 0.01 | HEDP | 0.02 | 5.0 | 2.5 |
| Example 22 | 0.01 | HEDP | 0.02 | 5.0 | 2.5 |
| Example 23 | 0.01 | HEDP | 0.02 | 5.0 | 2.5 |
| Example 24 | 0.1 | HEDP | 0.02 | 5.0 | 2.5 |
| Comparative Example 1 | 0.01 | HEDP | 0.02 | 5.0 | 2.5 |
| Comparative Example 2 | 0.01 | HEDP | 0.02 | 30.0 | 2.5 |
| Comparative Example 3 | 0.01 | HEDP | 0.02 | 90.0 | 2.5 |
| Comparative Example 4 | 0.01 | HEDP | 0.02 | 25.0 | 2.5 |
| Comparative Example 5 | 0.01 | HEDP | 0.02 | 60.0 | 2.5 |
| Comparative Example 6 | 0.01 | HEDP | 0.02 | 180.0 | 2.5 |
| Comparative Example 7 | 0.01 | HEDP | 0.02 | 60.0 | 2.5 |
| Comparative Example 8 | 0.01 | HEDP | 0.02 | 13.6 | 2.5 |
| Comparative Example 9 | 0.01 | HEDP | 0.02 | 40.9 | 2.5 |
| Comparative Example 10 | 0.01 | HEDP | 0.02 | 11.4 | 2.5 |
| Comparative Example 11 | 0.25 | HEDP | 0.02 | 225.0 | 2.5 |
| Comparative Example 12 | 0.25 | HEDP | 0.02 | 75.0 | 2.5 |
| Comparative Example 13 | 0.25 | HEDP | 0.02 | 112.5 | 2.5 |

TABLE 1C

| | N-free nonionic polymer | | | N-containing nonionic polymer | | |
|---|---|---|---|---|---|---|
| | Compound | Molecular weight | Content [mass %] | Compound | Molecular weight | Content [mass %] |
| Comparative Example 14 | PVA | 102000 | 0.10 | Poly-N-vinylacetamide | 50000 | 0.10 |
| Comparative Example 15 | PVA | 102000 | 0.10 | Polyvinylpyyrolidone | 45000 | 0.10 |
| Comparative Example 16 | PVA | 5000 | 0.10 | — | — | — |
| Comparative Example 17 | PVA | 10000 | 0.10 | — | — | — |
| Comparative Example 18 | PVA | 22000 | 0.10 | — | — | — |
| Comparative Example 19 | PVA | 102000 | 0.10 | — | — | — |
| Comparative Example 20 | — | — | — | Poly-N-vinylacetamide | 50000 | 0.10 |
| Comparative Example 21 | — | — | — | Poly-N-vinylacetamide | 300000 | 0.10 |
| Comparative Example 22 | — | — | — | Poly-N-vinylacetamide | 900000 | 0.10 |
| Comparative Example 23 | — | — | — | Polyvinylpyyrolidone | 9000 | 0.10 |
| Comparative Example 24 | — | — | — | Polyvinylpyyrolidone | 45000 | 0.10 |
| Comparative Example 25 | — | — | — | Polyvinylpyyrolidone | 250000 | 0.10 |
| Comparative Example 26 | PVA | 10000 | 0.10 | Poly-N-vinylacetamide | 50000 | 0.10 |

TABLE 1C-continued

| | | | | | | |
|---|---|---|---|---|---|---|
| Comparative Example 27 | PVA | 10000 | 0.10 | Polyvinylpyyrolidone | 45000 | 0.10 |
| Comparative Example 28 | PVA | 10000 | 0.10 | Poly-N-vinylacetamide | 50000 | 0.10 |
| Comparative Example 29 | PVA | 10000 | 0.10 | Polyvinylpyyrolidone | 45000 | 0.10 |
| Comparative Example 30 | PVA | 10000 | 0.10 | Poly-N-vinylacetamide | 50000 | 0.10 |
| Comparative Example 31 | PVA | 10000 | 0.10 | Polyvinylpyyrolidone | 45000 | 0.10 |

| | Anionic polymer AA/SA Copolymer Molecular weight 12000 | Chelating agent | | Molecular weight ratio of N- | |
|---|---|---|---|---|---|
| | Content [mass %] | Compound | Content [mass %] | containing/ N-free | pH |
| Comparative Example 14 | 0.1 | HEDP | 0.02 | 0.5 | 2.5 |
| Comparative Example 15 | 0.1 | HEDP | 0.02 | 0.4 | 2.5 |
| Comparative Example 16 | 0.25 | HEDP | 0.02 | — | 2.5 |
| Comparative Example 17 | 0.25 | HEDP | 0.02 | — | 2.5 |
| Comparative Example 18 | 0.25 | HEDP | 0.02 | — | 2.5 |
| Comparative Example 19 | 0.1 | HEDP | 0.02 | — | 2.5 |
| Comparative Example 20 | 0.25 | HEDP | 0.02 | — | 2.5 |
| Comparative Example 21 | 0.25 | HEDP | 0.02 | — | 2.5 |
| Comparative Example 22 | 0.25 | HEDP | 0.02 | — | 2.5 |
| Comparative Example 23 | 0.25 | HEDP | 0.02 | — | 2.5 |
| Comparative Example 24 | 0.25 | HEDP | 0.02 | — | 2.5 |
| Comparative Example 25 | 0.25 | HEDP | 0.02 | — | 2.5 |
| Comparative Example 26 | — | HEDP | 0.02 | 5.0 | 2.5 |
| Comparative Example 27 | — | HEDP | 0.02 | 4.5 | 2.5 |
| Comparative Example 28 | 0.1 | HEDP | 0.02 | 5.0 | 7.0 |
| Comparative Example 29 | 0.1 | HEDP | 0.02 | 4.5 | 7.0 |
| Comparative Example 30 | 0.1 | HEDP | 0.02 | 5.0 | 9.0 |
| Comparative Example 31 | 0.1 | HEDP | 0.02 | 4.5 | 9.0 |

TABLE 1D

| | N-free nonionic polymer | | | N-containing nonionic polymer | | |
|---|---|---|---|---|---|---|
| | Compound | Molecular weight | Content [mass %] | Compound | Molecular weight | Content [mass %] |
| Comparative | PVA | 5000 | 0.10 | — | — | — |
| Example 32 | PVA | 10000 | 0.10 | | | |
| Comparative | PVA | 5000 | 0.10 | — | — | — |
| Example 33 | PVA | 22000 | 0.10 | | | |
| Comparative | — | — | — | Poly-N-vinylacetamide | 50000 | 0.10 |
| Example 34 | | | | Poly-N-vinylacetamide | 900000 | 0.10 |
| Comparative | — | — | — | Polyvinylpyrrolidone | 9000 | 0.10 |
| Example 35 | | | | Polyvinylpyrrolidone | 250000 | 0.10 |

TABLE 1D-continued

| | Anionic polymer AA/SA Copolymer Molecular weight 12000 | Chelating agent | | Molecular weight ratio of N- | |
|---|---|---|---|---|---|
| | Content [mass %] | Compound | Content [mass %] | containing/ N-free | pH |
| Comparative Example 32 | 0.25 | HEDP | 0.02 | — | 2.5 |
| Comparative Example 33 | 0.25 | HEDP | 0.02 | — | 2.5 |
| Comparative Example 34 | 0.25 | HEDP | 0.02 | — | 2.5 |
| Comparative Example 35 | 0.2 | HEDP | 0.02 | — | 2.5 |

[Preparation of Polished Object]

Polished objects that had been polished in the following chemical mechanical polishing (CMP) step were prepared.

(CMP Step)

As objects to be polished, (1) a silicon wafer (TEOS substrate) (300 mm, blanket wafer, manufactured by ADVANTEC CO., LTD.) having a surface with a 10000 Å thick TEOS film formed thereon, (2) a polycrystalline silicon wafer (300 mm, manufactured by Advanced Materials Technology, INC.), and (3) a silicon wafer (SiN substrate) (300 mm, blanket wafer, manufactured by ADVANTEC CO., LTD.) having a surface with a 2500 Å thick SiN film formed thereon were prepared. Note that 1 Å=0.1 nm.

The above-prepared TEOS substrate and polycrystalline silicon wafer were polished using a polishing composition (composition: 2 mass % of sulfonic acid-modified colloidal silica (average primary particle size of 35 nm, average secondary particle size of 70 nm), 0.0006 mass % of maleic acid, 0.25 mass % of ammonium sulfate, solvent: water, pH: 3.0) under following conditions:

Note that sulfonic acid-modified colloidal silica produced using colloidal silica having an average primary particle size of 35 nm, an average secondary particle size of 70 nm, and an average association degree of 2 in the method described in "Sulfonic acid-functionalized silica through quantitative oxidation of thiol groups", Chem. Commun. 246-247 (2003) was prepared.

<Polishing Apparatus and Polishing Conditions>

Polishing apparatus: manufactured by Ebara Corporation, FREX300E

Polishing pad: manufactured by Fujibo Holdings, Inc., foamed polyurethane pad H800-Type1

Conditioner (dresser): nylon brush (manufactured by 3M Company)

Polishing pressure: 2.0 psi (1 psi=6894.76 Pa, the same applies to the following)

Rotational speed of platen: 80 rpm

Rotational speed of head: 80 rpm

Feed of polishing composition: free flowing

Feed rate of polishing composition: 200 mL/minute

Polishing time: 30 seconds.

(Rinse Polishing)

After polishing of the surface of each object to be polished in the above CMP step, the polished object was removed from the platen. Next, within the same polishing apparatus, the polished object was set on another platen, and then under the following conditions, the surface of the polished object was subjected to rinse polishing treatment using the compositions for surface treatment A1 to A24 prepared in Examples 1 to 24 above and the compositions for surface treatment B1 to B35 prepared in Comparative Examples 1 to 35 above.

<Rinse Polishing Apparatus and Rinse Polishing Conditions>

Polishing pressure: 1.0 psi

Rotational speed of platen: 60 rpm

Rotational speed of head: 80 rpm

Feed of composition for surface treatment: free flowing

Feed rate of composition for surface treatment: 300 mL/minute

Polishing time: 60 seconds.

After rinse polishing treatment, the surfaces of the TEOS substrate and the SiN substrate were subjected to brush cleaning for 20 seconds using an aqueous 0.3% $NH_3$ solution, followed by cleaning for 40 seconds with deionized water, and thereby obtaining rinse-polished objects that had been rinsed and polished. The surface of the poly-Si substrate was subjected to brush cleaning for 60 seconds using deionized water, thereby obtaining a rinse-polished object that had been rinsed and polished.

[Evaluation]

(Measurement of the Number of Residues)

The numbers of residues on the surfaces of the polished TEOS substrate, poly-Si substrate, and SiN substrate that had been subjected to rinse polishing treatment were evaluated respectively using an optical inspector Surf scan (registered trademark) SP5 manufactured by KLA-Tencor Japan Ltd. Specifically, in the cases of the polished TEOS substrate and the polished SiN substrate, the numbers of residues having diameters of more than 50 nm were counted on the remaining portion other than a portion 5 mm wide from the peripheral end (portion spreading from 0 mm to 5 mm in width when the peripheral end was defined as 0 mm) of one side of each of the TEOS substrate and the SiN substrate, and in the case of the polished poly-Si substrate, the number of residues having diameters of more than 70 nm was counted on the remaining portion other than a portion 5 mm wide from the peripheral end of one side of the poly-Si substrate. Then, the number of abrasive grain residues and the number of organic residues on the above polished TEOS substrate, poly-Si substrate and SiN substrate were measured by SEM observation using a Review SEM RS6000 manufactured by Hitachi High-Tech Corporation. First, 100 residues existing on the remaining portion other than the portion 5 mm wide from the peripheral end of one side of each of the polished TEOS substrate, the polished poly-Si substrate, and the polished SiN substrate were sampled by the SEM observation. Then, the residue types of the 100 sampled residues (abrasive grains or organic residues) were distinguished by visual SEM evaluation, and the numbers of the abrasive grain residues ($SiO_2$ residues) and the organic residues (pad debris, polymers, and the like) were confirmed respectively.

The following Tables 2A to 2D show the evaluation results. In Tables 2A to 2D, the "PVP" represents polyvinylpyrrolidone, the "PNVA" represents poly-N-vinylacetamide, the "PDMA" represents polydimethylacrylamide, the "PNVCL" represents poly-N-vinylcaprolactam, and the "PNIPAM" represents poly-N-isopropylacrylamide.

TABLE 2A

| | N-free nonionic polymer | | | N-containing nonionic polymer | | | Molecular weight ratio of N- | |
|---|---|---|---|---|---|---|---|---|
| | Compound | Molecular weight | Content [mass %] | Compound | Molecular weight | Content [mass %] | containing/ N-free | pH |
| Example 1 | PVA | 22000 | 0.10 | PVP | 9000 | 0.10 | 0.4 | 2.5 |
| Example 2 | PVA | 10000 | 0.10 | PVP | 9000 | 0.10 | 0.9 | 2.5 |
| Example 3 | PVA | 10000 | 0.10 | PDMA | 10000 | 0.10 | 1.0 | 2.5 |
| Example 4 | PVA | 5000 | 0.10 | PVP | 9000 | 0.10 | 1.8 | 2.5 |
| Example 5 | PVA | 22000 | 0.10 | PVP | 45000 | 0.10 | 2.0 | 2.5 |
| Example 6 | PVA | 22000 | 0.10 | PNVA | 50000 | 0.10 | 2.3 | 2.5 |
| Example 7 | PVA | 10000 | 0.10 | PNIPAM | 40000 | 0.10 | 4.0 | 2.5 |
| Example 8 | PVA | 10000 | 0.10 | Oxazoline group-containing polymer | 40000 | 0.10 | 4.0 | 2.5 |
| Example 9 | PVA | 10000 | 0.10 | PVP | 45000 | 0.10 | 4.5 | 2.5 |
| Example 10 | PVA | 10000 | 0.10 | PVP | 45000 | 0.10 | 4.5 | 3.5 |
| Example 11 | PVA | 10000 | 0.10 | PNVA | 50000 | 0.10 | 5.0 | 2.5 |
| Example 12 | PVA | 10000 | 0.10 | PNVA | 50000 | 0.10 | 5.0 | 3.5 |
| Example 13 | PVA | 10000 | 0.10 | PNVCL | 70000 | 0.10 | 7.0 | 2.5 |
| Example 14 | PVA | 5000 | 0.10 | PVP | 45000 | 0.10 | 9.0 | 2.5 |
| Example 15 | PVA | 5000 | 0.10 | PNVA | 50000 | 0.10 | 10.0 | 2.5 |

| | The number of residues | | | | | |
|---|---|---|---|---|---|---|
| | TEOS($SiO_2$) | | Poly-Si | | SiN | |
| | Abrasive grain residues | Organic residues | Abrasive grain residues | Organic residues | Abrasive grain residues | Organic residues |
| Example 1 | 10 | 22 | 14 | 21 | 2 | 2 |
| Example 2 | 11 | 23 | 11 | 21 | 2 | 2 |
| Example 3 | 10 | 26 | 11 | 22 | 5 | 5 |
| Example 4 | 13 | 29 | 12 | 21 | 1 | 4 |
| Example 5 | 13 | 26 | 13 | 27 | 4 | 5 |
| Example 6 | 11 | 21 | 11 | 22 | 3 | 2 |
| Example 7 | 3 | 22 | 3 | 29 | 3 | 8 |
| Example 8 | 5 | 27 | 4 | 28 | 3 | 3 |
| Example 9 | 3 | 21 | 0 | 19 | 2 | 5 |
| Example 10 | 5 | 21 | 1 | 21 | 15 | 17 |
| Example 11 | 2 | 15 | 2 | 18 | 3 | 4 |
| Example 12 | 4 | 20 | 3 | 22 | 11 | 18 |
| Example 13 | 2 | 35 | 3 | 34 | 2 | 3 |
| Example 14 | 7 | 50 | 5 | 49 | 5 | 5 |
| Example 15 | 5 | 51 | 1 | 46 | 4 | 3 |

TABLE 2B

| | N-free nonionic polymer | | | N-containing nonionic polymer | | | Molecular weight ratio of N- | |
|---|---|---|---|---|---|---|---|---|
| | Compound | Molecular weight | Content [mass %] | Compound | Molecular weight | Content [mass %] | containing/ N-free | pH |
| Example 16 | PVA | 10000 | 0.01 | PNVA | 50000 | 0.10 | 5.0 | 2.5 |
| Example 17 | PVA | 10000 | 0.10 | PNVA | 50000 | 0.01 | 5.0 | 2.5 |
| Example 18 | PVA | 10000 | 0.01 | PNVA | 50000 | 0.01 | 5.0 | 2.5 |
| Example 19 | PVA | 10000 | 0.20 | PNVA | 50000 | 0.10 | 5.0 | 2.5 |
| Example 20 | PVA | 10000 | 0.10 | PNVA | 50000 | 0.20 | 5.0 | 2.5 |
| Example 21 | PVA | 10000 | 0.20 | PNVA | 50000 | 0.20 | 5.0 | 2.5 |
| Example 22 | PVA | 10000 | 0.01 | PNVA | 50000 | 0.20 | 5.0 | 2.5 |
| Example 23 | PVA | 10000 | 0.20 | PNVA | 50000 | 0.01 | 5.0 | 2.5 |
| Example 24 | PVA | 10000 | 0.10 | PNVA | 50000 | 0.10 | 5.0 | 2.5 |
| Comparative Example 1 | PVA | 10000 | 0.10 | PNVA | 300000 | 0.10 | 30.0 | 2.5 |
| Comparative Example 2 | PVA | 10000 | 0.10 | PNVA | 900000 | 0.10 | 90.0 | 2.5 |
| Comparative Example 3 | PVA | 10000 | 0.10 | PVP | 250000 | 0.10 | 25.0 | 2.5 |
| Comparative Example 4 | PVA | 5000 | 0.10 | PNVA | 300000 | 0.10 | 60.0 | 2.5 |
| Comparative Example 5 | PVA | 5000 | 0.10 | PNVA | 900000 | 0.10 | 180.0 | 2.5 |
| Comparative Example 6 | PVA | 5000 | 0.10 | PVP | 250000 | 0.10 | 50.0 | 2.5 |
| Comparative Example 7 | PVA | 22000 | 0.10 | PNVA | 300000 | 0.10 | 13.6 | 2.5 |
| Comparative Example 8 | PVA | 22000 | 0.10 | PNVA | 900000 | 0.10 | 40.9 | 2.5 |

| | The number of residues | | | | | |
|---|---|---|---|---|---|---|
| | TEOS($SiO_2$) | | Poly-Si | | SiN | |
| | Abrasive grain residues | Organic residues | Abrasive grain residues | Organic residues | Abrasive grain residues | Organic residues |
| Example 16 | 5 | 26 | 1 | 26 | 4 | 4 |
| Example 17 | 7 | 23 | 8 | 28 | 4 | 4 |
| Example 18 | 4 | 28 | 4 | 21 | 1 | 5 |
| Example 19 | 9 | 21 | 3 | 29 | 3 | 7 |
| Example 20 | 5 | 24 | 2 | 28 | 6 | 2 |
| Example 21 | 4 | 26 | 6 | 22 | 4 | 5 |
| Example 22 | 7 | 21 | 8 | 23 | 2 | 7 |
| Example 23 | 6 | 22 | 7 | 27 | 3 | 4 |
| Example 24 | 6 | 27 | 1 | 26 | 1 | 3 |
| Comparative Example 1 | 3 | 102 | 1 | 83 | 3 | 7 |
| Comparative Example 2 | 5 | 122 | 0 | 97 | 7 | 8 |
| Comparative Example 3 | 4 | 106 | 1 | 85 | 5 | 7 |
| Comparative Example 4 | 9 | 108 | 4 | 85 | 6 | 9 |
| Comparative Example 5 | 5 | 141 | 0 | 83 | 3 | 7 |
| Comparative Example 6 | 4 | 110 | 9 | 91 | 7 | 6 |
| Comparative Example 7 | 5 | 121 | 4 | 90 | 6 | 6 |
| Comparative Example 8 | 3 | 139 | 2 | 98 | 7 | 4 |

TABLE 2C

| | N-free nonionic polymer | | | N-containing nonionic polymer | | | Molecular weight ratio of N- | |
|---|---|---|---|---|---|---|---|---|
| | Compound | Molecular weight | Content [mass %] | Compound | Molecular weight | Content [mass %] | containing/ N-free | pH |
| Comparative Example 9 | PVA | 22000 | 0.10 | PVP | 250000 | 0.10 | 11.4 | 2.5 |
| Comparative Example 10 | PEG | 200 | 0.10 | PVP | 45000 | 0.10 | 225.0 | 2.5 |
| Comparative Example 11 | PEG | 600 | 0.10 | PVP | 45000 | 0.10 | 75.0 | 2.5 |
| Comparative Example 12 | PPG | 400 | 0.10 | PVP | 45000 | 0.10 | 112.5 | 2.5 |
| Comparative Example 13 | PPG | 1000 | 0.10 | PVP | 45000 | 0.10 | 45.0 | 2.5 |
| Comparative Example 14 | PVA | 102000 | 0.10 | PNVA | 50000 | 0.10 | 0.5 | 2.5 |
| Comparative Example 15 | PVA | 102000 | 0.10 | PVP | 45000 | 0.10 | 0.4 | 2.5 |
| Comparative Example 16 | PVA | 5000 | 0.10 | — | — | — | — | 2.5 |
| Comparative Example 17 | PVA | 10000 | 0.10 | — | — | — | — | 2.5 |
| Comparative Example 18 | PVA | 22000 | 0.10 | — | — | — | — | 2.5 |
| Comparative Example 19 | PVA | 102000 | 0.10 | — | — | — | — | 2.5 |
| Comparative Example 20 | — | — | — | PNVA | 50000 | 0.10 | — | 2.5 |
| Comparative Example 21 | — | — | — | PNVA | 300000 | 0.10 | — | 2.5 |
| Comparative Example 22 | — | — | — | PNVA | 900000 | 0.10 | — | 2.5 |
| Comparative Example 23 | — | — | — | PVP | 9000 | 0.10 | — | 2.5 |
| Comparative Example 24 | — | — | — | PVP | 45000 | 0.10 | — | 2.5 |
| Comparative Example 25 | — | — | — | PVP | 250000 | 0.10 | — | 2.5 |

| | The number of residues | | | | | |
|---|---|---|---|---|---|---|
| | TEOS($SiO_2$) | | Poly-Si | | SiN | |
| | Abrasive grain residues | Organic residues | Abrasive grain residues | Organic residues | Abrasive grain residues | Organic residues |
| Comparative Example 9 | 6 | 112 | 4 | 93 | 2 | 7 |
| Comparative Example 10 | 4 | 96 | 4 | 88 | 5 | 5 |
| Comparative Example 11 | 6 | 93 | 3 | 91 | 8 | 4 |
| Comparative Example 12 | 7 | 98 | 5 | 108 | 3 | 5 |
| Comparative Example 13 | 9 | 69 | 8 | 99 | 3 | 7 |
| Comparative Example 14 | 8 | 183 | 7 | 113 | 4 | 6 |
| Comparative Example 15 | 6 | 167 | 3 | 121 | 8 | 9 |
| Comparative Example 16 | 193 | 66 | 39 | 512 | 4 | 5 |
| Comparative Example 17 | 108 | 63 | 28 | 419 | 3 | 6 |
| Comparative Example 18 | 155 | 61 | 41 | 913 | 2 | 5 |
| Comparative Example 19 | 161 | 165 | 43 | 899 | 3 | 6 |
| Comparative Example 20 | 11 | 64 | 4 | 100 | 2 | 4 |
| Comparative Example 21 | 18 | 63 | 1 | 95 | 1 | 4 |

TABLE 2C-continued

| | | | | | | |
|---|---|---|---|---|---|---|
| Comparative Example 22 | 19 | 61 | 3 | 71 | 5 | 7 |
| Comparative Example 23 | 9 | 44 | 6 | 119 | 8 | 6 |
| Comparative Example 24 | 15 | 65 | 2 | 72 | 3 | 8 |
| Comparative Example 25 | 10 | 55 | 3 | 109 | 3 | 9 |

TABLE 2D

| | N-free nonionic polymer | | | N-containing nonionic polymer | | | Molecular weight ratio of N- | |
|---|---|---|---|---|---|---|---|---|
| | Compound | Molecular weight | Content [mass %] | Compound | Molecular weight | Content [mass %] | containing/ N-free | pH |
| Comparative Example 26 | PVA | 10000 | 0.10 | PNVA | 50000 | 0.10 | 5.0 | 2.5 |
| Comparative Example 27 | PVA | 10000 | 0.10 | PVP | 45000 | 0.10 | 4.5 | 2.5 |
| Comparative Example 28 | PVA | 10000 | 0.10 | PNVA | 50000 | 0.10 | 5.0 | 7.0 |
| Comparative Example 29 | PVA | 10000 | 0.10 | PVP | 45000 | 0.10 | 4.5 | 7.0 |
| Comparative Example 30 | PVA | 10000 | 0.10 | PNVA | 50000 | 0.10 | 5.0 | 9.0 |
| Comparative Example 31 | PVA | 10000 | 0.10 | PVP | 45000 | 0.10 | 4.5 | 9.0 |
| Comparative Example 32 | PVA<br>PVA | 5000<br>10000 | 0.10<br>0.10 | — | — | — | — | 2.5 |
| Comparative Example 33 | PVA<br>PVA | 5000<br>22000 | 0.10<br>0.10 | — | — | — | — | 2.5 |
| Comparative Example 34 | — | — | — | PNVA<br>PNVA | 50000<br>900000 | 0.10<br>0.10 | — | 2.5 |
| Comparative Example 35 | — | — | — | PVP<br>PVP | 9000<br>250000 | 0.10<br>0.10 | — | 2.5 |

| | The number of residues | | | | | |
|---|---|---|---|---|---|---|
| | TEOS($SiO_2$) | | Poly-Si | | SiN | |
| | Abrasive grain residues | Organic residues | Abrasive grain residues | Organic residues | Abrasive grain residues | Organic residues |
| Comparative Example 26 | 43 | 48 | 52 | 21 | >1000 | >1000 |
| Comparative Example 27 | 53 | 39 | 54 | 26 | >1000 | >1000 |
| Comparative Example 28 | 46 | 40 | 56 | 37 | >1000 | >1000 |
| Comparative Example 29 | 39 | 37 | 51 | 41 | >1000 | >1000 |
| Comparative Example 30 | 43 | 47 | 48 | 26 | >1000 | >1000 |
| Comparative Example 31 | 42 | 49 | 53 | 39 | >1000 | >1000 |
| Comparative Example 32 | 181 | 48 | 37 | 336 | 6 | 7 |
| Comparative Example 33 | 176 | 51 | 29 | 209 | 2 | 3 |
| Comparative Example 34 | 9 | 147 | 1 | 96 | 3 | 3 |
| Comparative Example 35 | 8 | 140 | 1 | 90 | 3 | 5 |

As is clear from above Tables 2A to 2D, it was found that the compositions for surface treatment A1 to A24 of Examples 1 to 24 were able to reduce residues on the surfaces of the polished objects containing silicon-containing material as compared with the composition for surface treatment B1 to B35 of Comparative Examples 1 to 35.

The above is the results of the evaluation immediately after the production of the compositions for surface treatment, and the compositions preferably contain an antifungal agent (antiseptic agent) in the case of long-term preservation or storage. Note that it is considered that since the antifungal agent (antiseptic agent) has almost no influence on the above results, in the cases of the compositions for surface treatment containing the antifungal agent (antiseptic agent), the results are also the same.

The present application is based on the Japanese patent application No. 2022-056460 filed on Mar. 30, 2022, and the disclosed contents thereof is incorporated herein by reference in their entirety.

The invention claimed is:

1. A composition for surface treatment, comprising: a nitrogen-free nonionic polymer, a nitrogen-containing nonionic polymer, and an anionic polymer, and comprising substantially no abrasive grains, wherein the nitrogen-free nonionic polymer has a weight-average molecular weight of less than 100,000, a ratio of a weight-average molecular weight of the nitrogen-containing nonionic polymer to the weight-average molecular weight of the nitrogen-free nonionic polymer (nitrogen-containing nonionic polymer/nitrogen-free nonionic polymer) is 0.1 or more and 8 or less, and the composition for surface treatment has a pH of less than 7.0.

2. The composition for surface treatment according to claim 1, wherein the nitrogen-containing nonionic polymer has an amide bond.

3. The composition for surface treatment according to claim 1, wherein the nitrogen-containing nonionic polymer has a weight-average molecular weight of 80,000 or less.

4. The composition for surface treatment according to claim 1, wherein the nitrogen-containing nonionic polymer is one or more selected from the group consisting of polyvinylpyrrolidone, poly-N-vinylacetamide, polydimethylacrylamide, polyvinyl caprolactam, N-isopropylacrylamide, and oxazoline group-containing polymers.

5. The composition for surface treatment according to claim 1, wherein a ratio of a weight-average molecular weight of the nitrogen-containing nonionic polymer to a weight-average molecular weight of the nitrogen-free nonionic polymer (nitrogen-containing nonionic polymer/nitrogen-free nonionic polymer) is 0.3 or more and 6 or less.

6. The composition for surface treatment according to claim 1, wherein the nitrogen-free nonionic polymer is polyvinyl alcohol.

7. The composition for surface treatment according to claim 1, further comprising a chelating agent having two or more phosphoric acid groups.

8. The composition for surface treatment according to claim 1, wherein the nitrogen-free nonionic polymer is one or more selected from the group consisting of polyvinyl alcohol, polyethylene glycol, polypropylene glycol, and hydroxyethyl cellulose, and the nitrogen-containing nonionic polymer is one or more selected from the group consisting of polyvinylpyrrolidone, poly-N-vinylacetamide, polydimethylacrylamide, polyvinylcaprolactam, N-isopropylacrylamide, and oxazoline group-containing polymers.

9. The composition for surface treatment according to claim 8, the nitrogen-free nonionic polymer has a weight-average molecular weight of 5,500 or more and less than 100,000.

10. The composition for surface treatment according to claim 9, wherein the nitrogen-free nonionic polymer has a weight-average molecular weight of 5,500 or more and 50,000 or less, and wherein the nitrogen-containing nonionic polymer has a weight-average molecular weight of 5,000 or more and 100,000 or less.

11. The composition for surface treatment according to claim 10, wherein the pH is less than 5.

12. The composition for surface treatment according to claim 11, the composition for surface treatment consists of the nitrogen-free nonionic polymer, the nitrogen-containing nonionic polymer, the anionic polymer, solvent and an additive, wherein the additive is one or more selected from the group consisting of an anionic polymer, other polymers than the nitrogen-free nonionic polymer, nitrogen-containing nonionic polymer, and anionic polymer, chelating agent, surfactant, pH adjusting agent, antifungal agent, dissolved gas, reducing agent, and oxidizing agent.

13. The composition for surface treatment according to claim 10, wherein the pH is less than 4.

14. A surface treatment method, comprising surface-treating a polished object using the composition for surface treatment according to claim 1, the polished object comprising silicon nitride and at least one selected from the group consisting of silicon oxide and polysilicon, to reduce a residue on a surface of the polished object.

15. The surface treatment method according to claim 14, wherein the surface treatment method is a rinse polishing treatment method or a cleaning treatment method.

16. A method for producing a semiconductor substrate, wherein a polished object is a polished semiconductor substrate, the method comprising:

a polishing step of polishing a semiconductor substrate before polishing using a polishing composition comprising abrasive grains, the semiconductor substrate before polishing comprising silicon nitride and at least one selected from the group consisting of silicon oxide and polysilicon, to obtain the polished semiconductor substrate; and a surface treatment step of reducing a residue comprising the abrasive grains on a surface of the polished semiconductor substrate using the composition for surface treatment according to claim 1.

17. The method for producing a semiconductor substrate according to claim 16, wherein the polishing composition has a pH of 2 or more and 6 or less.

* * * * *